(12) United States Patent
Kim et al.

(10) Patent No.: US 9,472,500 B2
(45) Date of Patent: Oct. 18, 2016

(54) NONVOLATILE MEMORY DEVICES HAVING SINGLE-LAYERED GATES

(71) Applicant: SK hynix Inc., Gyeonggi-do (KR)

(72) Inventors: Jung Hoon Kim, Gyeonggi-do (KR); Sung Kun Park, Chungcheongbuk-do (KR); Nam Yoon Kim, Chungcheongbuk-do (KR)

(73) Assignee: SK Hynix Inc., Gyeonggi-do (KR)

( * ) Notice: Subject to any disclaimer, the term of this patent is extended or adjusted under 35 U.S.C. 154(b) by 54 days.

(21) Appl. No.: 14/678,650

(22) Filed: Apr. 3, 2015

(65) Prior Publication Data

US 2016/0126247 A1    May 5, 2016

(30) Foreign Application Priority Data

Oct. 31, 2014  (KR) .................. 10-2014-0150677

(51) Int. Cl.
*H01L 23/528*    (2006.01)
*H01L 29/06*    (2006.01)
*H01L 29/423*    (2006.01)
*H01L 27/115*    (2006.01)

(52) U.S. Cl.
CPC ....... *H01L 23/528* (2013.01); *H01L 27/11519* (2013.01); *H01L 27/11524* (2013.01); *H01L 29/0688* (2013.01); *H01L 29/42328* (2013.01)

(58) Field of Classification Search
CPC .................. H01L 27/11521; H01L 29/0688
See application file for complete search history.

(56) References Cited

U.S. PATENT DOCUMENTS

| | | | |
|---|---|---|---|
| 6,920,067 B2 | 7/2005 | Hsu et al. | |
| 2007/0296034 A1 | 12/2007 | Chen et al. | |
| 2013/0020626 A1* | 1/2013 | Tan | H01L 27/11521 257/316 |
| 2016/0093628 A1* | 3/2016 | Chen | H01L 29/66825 257/296 |

* cited by examiner

*Primary Examiner* — Marc Armand
(74) *Attorney, Agent, or Firm* — I P & T Group LLP

(57) ABSTRACT

A nonvolatile memory device includes an active region extending in a first direction, a first single-layered gate intersecting the active region and extending in a second direction, a second single-layered gate intersecting the active region and extending in the second direction, and a selection gate intersecting the active region. The selection gate includes a first selection gate main line and a second selection gate main line that intersect the active region to be parallel with the first and second single-layered gates, a selection gate interconnection line that connects a first end of the first selection gate main line to a first end of the second selection gate main line, and a selection gate extension that extends from a portion of the selection gate interconnection line to be disposed between first ends of the first and second single-layered gates.

17 Claims, 12 Drawing Sheets

NONVOLATILE MEMORY DEVICES HAVING SINGLE-LAYERED GATES

CROSS-REFERENCES TO RELATED APPLICATIONS

The present application claims priority under 35 U.S.C 119(a) to Korean Application No. 10-2014-0150677, filed on Oct. 31, 2014, in the Korean intellectual property Office, which is incorporated herein by reference in its entirety.

BACKGROUND

1. Technical Field

Embodiments of the present disclosure relate to nonvolatile memory devices and, more particularly, to nonvolatile memory devices having single-layered gates.

2. Related Art

Nonvolatile memory devices retain stored data even when their power supplies are interrupted. Various cell structures and various cell array schemes of nonvolatile memory devices have been proposed to improve their performance. A typical unit memory cell of nonvolatile memory devices employs a stacked gate structure. This includes a gate insulation layer (referred to as a tunnel insulation layer), a floating gate, an inter-gate dielectric layer, and a control gate, which are sequentially stacked on a semiconductor substrate.

As electronic systems become smaller with the development of new fabrication techniques, system-on-chip (SOC) products have evolved and become important in high performance digital systems. Each of the SOC products may include a plurality of semiconductor devices executing various functions in a single chip. For example, the SOC product may include at least one logic device and at least one memory device which are integrated in a single chip. Thus, fabrication technologies of embedded nonvolatile memory devices may be required to embed the nonvolatile memory devices in the SOC products.

In order to embed the nonvolatile memory devices in the SOC products, the process technology of nonvolatile memory devices has to be compatible with the process technology of the logic device included in the SOC products. In general, logic devices employ transistors having a single gate structure whereas nonvolatile memory devices employ cell transistors having a stacked gate structure, such as a double gate structure. Thus, complicated process technology may be required to fabricate SOC products that include nonvolatile memory devices and logic devices. Accordingly, nonvolatile memory devices employing a single-layered gate cell structure are very attractive as candidates for embedded nonvolatile memory devices. That is, complementary metal-oxide-semiconductor (CMOS) process technologies for fabricating logic devices may be readily applied to fabrication of nonvolatile memory devices employing single-layered gates. As a result, when SOC products are designed to include nonvolatile memory devices employing a single-layered gate cell structure, the SOC products may be readily fabricated using CMOS process technologies.

SUMMARY

Various embodiments are directed to nonvolatile memory devices having single-layered gates.

According to an embodiment, a nonvolatile memory device includes an active region extending in a first direction, a first single-layered gate intersecting the active region and extending in a second direction, a second single-layered gate intersecting the active region to be spaced apart from the first single-layered gate in the first direction and extending in the second direction, and a selection gate intersecting the active region. The selection gate includes a first selection gate main line and a second selection gate main line that intersect the active region to be parallel with the first and second single-layered gates, a selection gate interconnection line that connects a first end of the first selection gate main line to a first end of the second selection gate main line, and a selection gate extension that extends from a portion of the selection gate interconnection line to be disposed between first ends of the first and second single-layered gates. The first selection gate main line is at a side of the first single-layered gate, opposite to the second single-layered gate, and the second selection gate main line is at a side of the second single-layered gate, opposite to the first single-layered gate.

According to another embodiment, a nonvolatile memory device includes an active region extending in a first direction, a first single-layered gate intersecting the active region and extending in a second direction, a second single-layered gate intersecting the active region to be spaced apart from the first single-layered gate in the first direction and extending in the second direction, and a selection gate intersecting the active region. The selection gate includes a first selection gate main line and a second selection gate main line that intersect the active region to be parallel with the first and second single-layered gates, a first selection gate interconnection line that connects a first end of the first selection gate main line to a first end of the second selection gate main line, a second selection gate interconnection line that connects a second end of the first selection gate main line to a second end of the second selection gate main line, a first selection gate extension that extends from a portion of the first selection gate interconnection line to be disposed between first ends of the first and second single-layered gates, and a second selection gate extension that extends from a portion of the second selection gate interconnection line to be disposed between second ends of the first and second single-layered gates. The first selection gate main line is at a side of the first single-layered gate, opposite to the second single-layered gate, and the second selection gate main line is at a side of the second single-layered gate, opposite to the first single-layered gate.

According to still another embodiment, a nonvolatile memory device includes an active region extending in a first direction, a first single-layered gate intersecting the active region and extending in a second direction, a second single-layered gate intersecting the active region to be spaced apart from the first single-layered gate in the first direction and extending in the second direction, and a first selection gate and a second selection gate intersecting the active region. The first selection gate includes a first selection gate main line that intersects the active region to be parallel with the first single-layered gate, a first selection gate extension that is disposed between first ends of the first and second single-layered gates, and a first selection gate interconnection line that connects a first end of the first selection gate main line to a first end of the first selection gate extension. The second selection gate includes a second selection gate main line that intersects the active region to be parallel with the second single-layered gate, a second selection gate extension that is disposed between second ends of the first and second single-layered gates, and a second selection gate interconnection line that connects a first end of the second selection gate main line to a first end of the second selection gate extension. The first selection gate main line is at a side of the first single-layered gate, opposite to the second single-layered gate, and the second selection gate main line is at a side of the second single-layered gate, opposite to the first single-layered gate.

BRIEF DESCRIPTION OF THE DRAWINGS

Embodiments of the present disclosure will become more apparent in view of the attached drawings and accompanying detailed description, in which.

DETAILED DESCRIPTION OF THE EMBODIMENTS

When a unit cell of nonvolatile memory devices is realized using a single-layered gate scheme, an array control gate (ACG) may be required to induce a coupling voltage at a single-layered floating gate. In general, the ACG may be formed in a substrate to overlap with the single-layered floating gate disposed on the substrate. In this case, the unit cell should be designed such that an overlap area between the single-layered floating gate and the ACG is greater than a specific value. This is because as the overlap area between the single-layered floating gate and the ACG increases, a coupling ratio of the unit cell increases to improve performance of the unit cell. However, as the overlap area between the single-layered floating gate and the ACG increases, a planar area that the unit cell occupies may also increase to degrade the integration density of the nonvolatile memory device. In the following embodiments, a coupling voltage of the single-layered floating gate may be induced by a selection gate disposed to surround sidewalls of the single-layered floating gate without use of the ACG. Particularly, a word line connected to the selection gate may additionally overlap with the single-layered floating gate. And, a plurality of parasitic capacitive components between the word line and the single-layered floating gate may be connected in parallel to increase a coupling ratio of the unit cell.

It will be understood that although the terms first, second, third etc. may be used herein to describe various elements, these elements should not be limited by these terms. These terms are only used to distinguish one element from another element. Thus, a first element in some embodiments could be termed a second element in other embodiments without departing from the teachings of the present disclosure.

It will also be understood that when an element is referred to as being located "on", "over", "above", "under", "beneath" or "below" another element, it may directly contact the other element, or at least one intervening element may be present therebetween. Accordingly, the terms such as "on", "over", "above", "under", "beneath", "below" and the like that are used herein are for the purpose of describing particular embodiments only and are not intended to limit the scope of the present disclosure.

It will be further understood that when an element is referred to as being "connected" or "coupled" to another element, it can be directly connected or coupled to the other element or intervening elements may be present.

Figure 1:
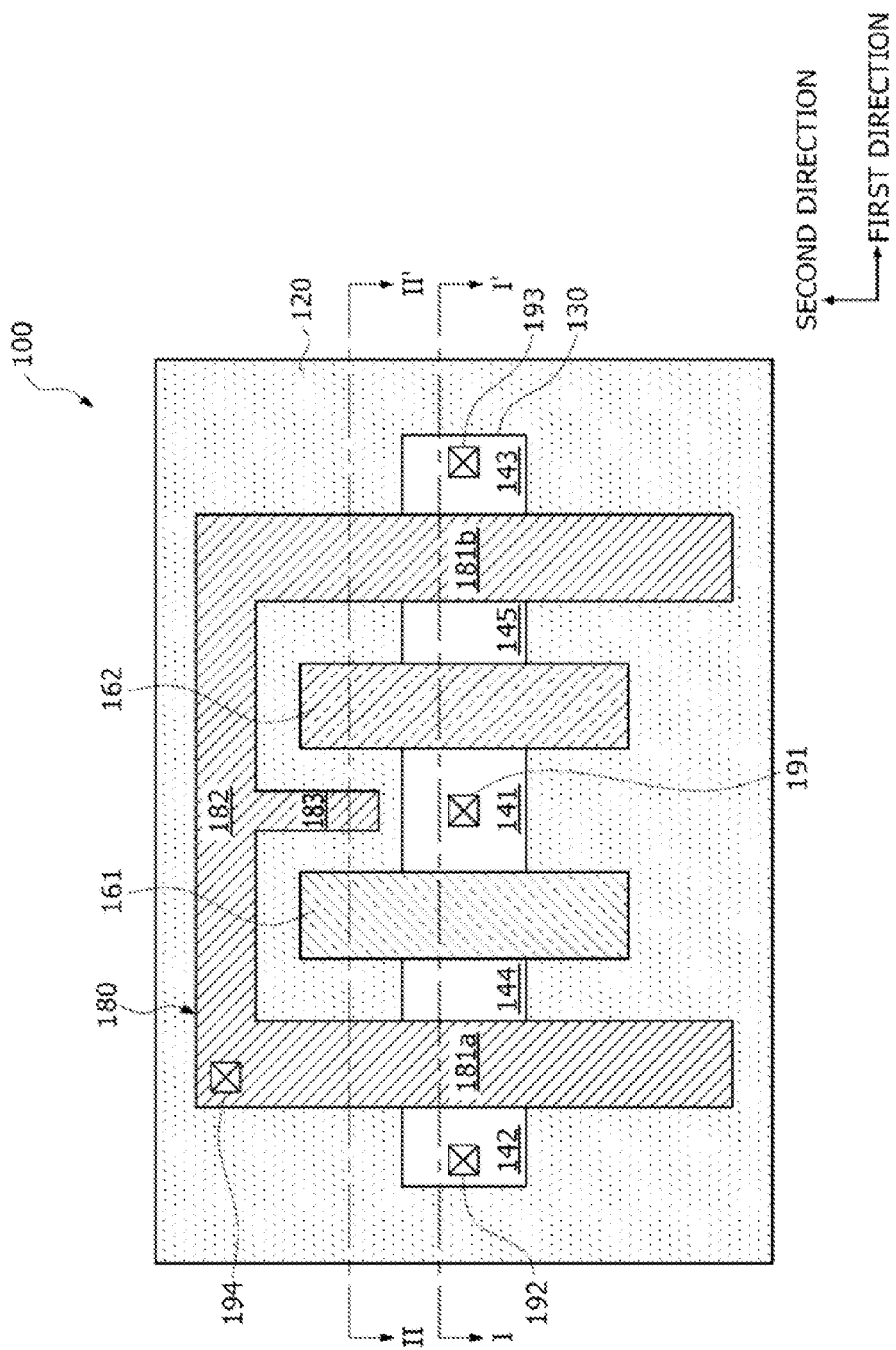
FIG. 1 is a layout diagram illustrating a unit cell of a nonvolatile memory device according to an embodiment.
Figure 2:
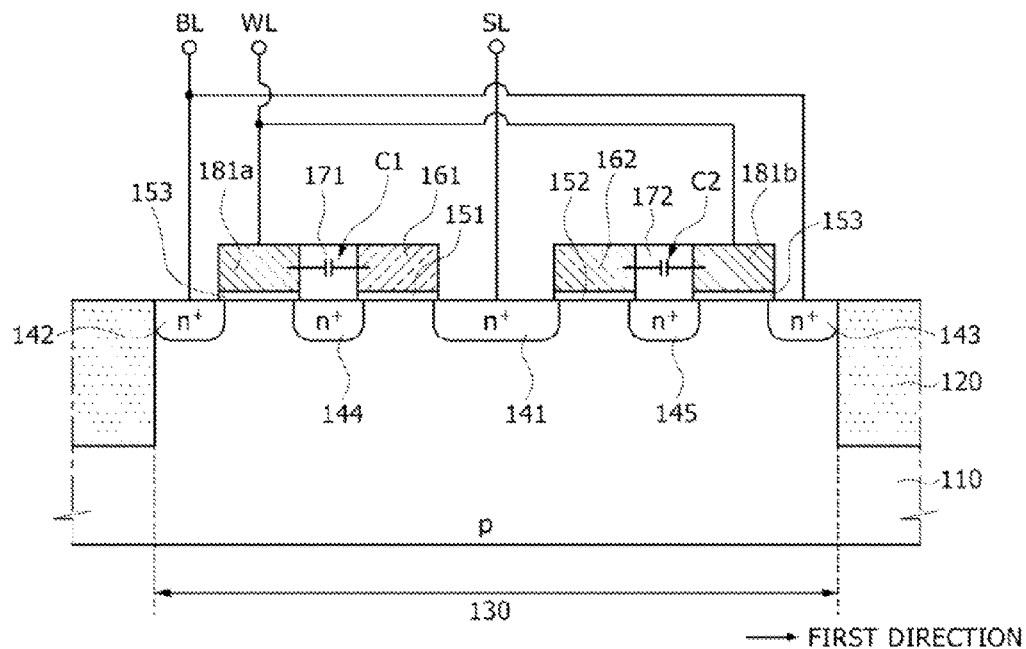
FIG. 2 is a cross-sectional view taken along a line I-I' of FIG. 1.

FIG. 1 is a layout diagram illustrating a unit cell 100 of a nonvolatile memory device according to an embodiment. FIG. 2 is a cross-sectional view taken along a line I-I' of FIG. 1, and FIG. 3 is a cross-sectional view taken along a line II-II' of FIG. 1.

Figure 3:
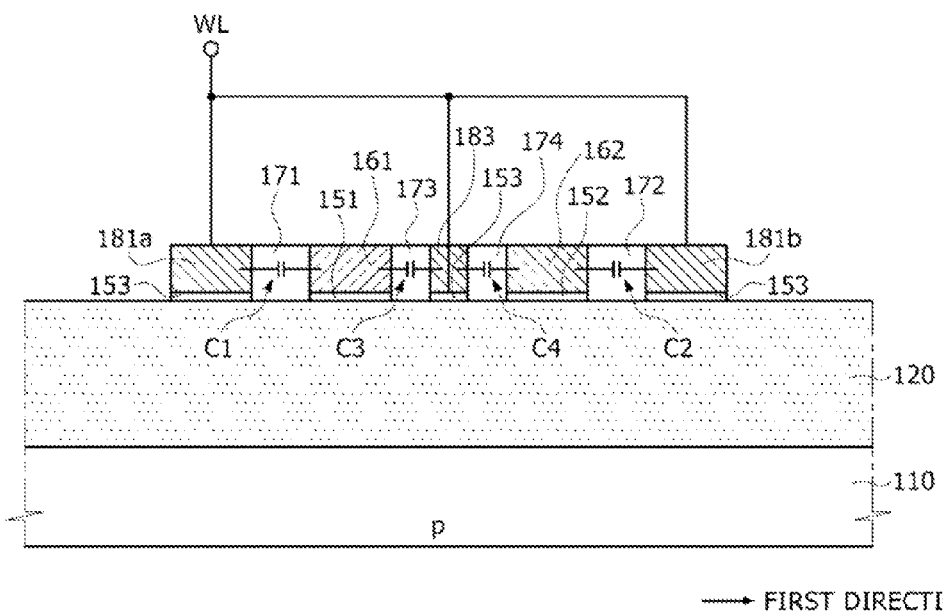
FIG. 3 is a cross-sectional view taken along a line II-II' of FIG. 1.

Referring to FIGS. 1 to 3, the unit cell 100 may include an active region 130 that is defined by an isolation layer 120 formed in a substrate 110. In some embodiments, the substrate 110 may be a single crystalline silicon substrate. Alternatively, the substrate 110 may be a semiconductor substrate other than a silicon substrate. In some embodiments, the substrate 110 may be a silicon-on-insulator (SOI) substrate including a support substrate, a buried insulation layer and a single crystalline silicon layer, which are sequentially stacked. When the substrate 110 includes a semiconductor substrate or a semiconductor layer, the semiconductor substrate or the semiconductor layer may have a first conductivity type, for example, a P-type. When the substrate 110 has a second conductivity type, i.e., an N-type, opposite to the first conductivity type, a well region having the first conductivity type may be disposed in the substrate 110. The active region 130 may extend in a first direction. In the present embodiment, the first direction may be an arbitrary direction, and a second direction may be substantially perpendicular to the first direction.

A first impurity junction region 141, a second impurity junction region 142, a third impurity junction region 143, a fourth impurity junction region 144 and a fifth impurity junction region 145 may be disposed in an upper region of the active region 130 to be spaced apart from each other along the first direction. In some embodiments, the first impurity junction region 141 may act as a common source region, and the second and third impurity junction regions 142 and 143 may act as drain regions. All of the first to fifth impurity junction regions 141 to 145 may be heavily doped with impurities of the second conductivity type, for example, N-type impurities. The first impurity junction region 141 may be disposed in a central region of the active region 130. The second and third impurity junction regions 142 and 143 may be disposed in both ends of the active region 130, respectively. The fourth impurity junction region 144 may be disposed between the first and second impurity junction regions 141 and 142, and the fifth impurity junction region 145 may be disposed between the first and third impurity junction regions 141 and 143.

A first gate insulation layer 151 and a first single-layered gate 161 may be sequentially stacked on the active region 130 between the first and fourth impurity junction regions 141 and 144. A second gate insulation layer 152 and a second single-layered gate 162 may be sequentially stacked on the active region 130 between the first and fifth impurity junction regions 141 and 145. In some embodiments, each of the first and second gate insulation layers 151 and 152 may include a silicon oxide layer, and each of the first and second single-layered gates 161 and 162 may include a polysilicon layer. The first impurity junction region 141 may be exposed by a space between the first and second single-layered gates 161 and 162. As illustrated in FIG. 1, the first and second single-layered gates 161 and 162 may be disposed to intersect the active region 130 and to extend in the second direction. Thus, a portion of the first single-layered gate 161 may overlap with the active region 130, and the remaining portion of the first single-layered gate 161 may overlap with the isolation layer 120. Similarly, a portion of the second single-layered gate 162 may overlap with the active region 130, and the remaining portion of the second single-layered gate 162 may overlap with the isolation layer 120.

A selection gate 180 may include a first selection gate main line 181a, a second selection gate main line 181b, a selection gate interconnection line 182, and a selection gate extension 183. A third gate insulation layer 153 may be disposed between the selection gate 180 and the substrate 110. That is, the third gate insulation layer 153 may be disposed between the selection gate 180 and the active region 130, and between the selection gate 180 and the isolation layer 120. In some embodiments, the third gate insulation layer 153 may include a silicon oxide layer, and the selection gate 180 may include a polysilicon layer.

The first selection gate main line 181a may be disposed to overlap with the active region 130 between the second and fourth impurity junction regions 142 and 144. Specifically, the first selection gate main line 181a may intersect the active region 130 and may extend in the second direction to be parallel with the first single-layered gate 161. The first selection gate main line 181a may be disposed at one side of the first single-layered gate 161 opposite to the second single-layered gate 162. The second selection gate main line 181b may be disposed to overlap with the active region 130 between the third and fifth impurity junction regions 143 and 145. Specifically, the second selection gate main line 181b may intersect the active region 130 and may extend in the second direction to be parallel with the second single-layered gate 162. The second selection gate main line 181b may be disposed at one side of the second single-layered gate 162 opposite to the first single-layered gate 161.

The selection gate interconnection line 182 may connect a first end of the first selection gate main line 181a to a first end of the second selection gate main line 181b. As illustrated in FIG. 1, the selection gate interconnection line 182 may not overlap with the active region 130 but overlap with the isolation layer 120. The selection gate interconnection line 182 may extend parallel to the active region, i.e., in the first direction, to have a stripe or line shape. The selection gate interconnection line 182 may be spaced apart from the first and second single-layered gates 161 and 162 by a certain distance.

The selection gate extension 183 may extend from a portion of a sidewall of the selection gate interconnection line 182 to have a certain length. As illustrated in FIG. 1, the selection gate extension 183 may extend in an opposite direction to the second direction. That is, the selection gate extension 183 may extend perpendicular to the selection gate interconnection line 182, i.e., from the selection gate interconnection line 182 toward the active region 130. Thus, the selection gate extension 183 may be disposed between the first and second single-layered gates 161 and 162. Accordingly, an end of the selection gate extension 183 may be adjacent to the active region 130. The selection gate extension 183 may not overlap with the active region 130 but overlap with the isolation layer 120.

In the present embodiment, the selection gate interconnection line 182 may be disposed at a first side of the active region 130. Alternatively, in some embodiments, the selection gate interconnection line 182 may be disposed at a second side of the active region 130 opposite to the first side of the active region 130 to connect a second end of the first selection gate main line 181a to a second end of the second selection gate main line 181b. In this case, the selection gate extension 183 may extend from a portion of a sidewall of the selection gate interconnection line 182 in the second direction to be disposed between the first and second single-layered gates 161 and 162.

As illustrated in FIGS. 2 and 3, a first dielectric layer 171 may be disposed between the first single-layered gate 161 and the first selection gate main line 181a, and a second dielectric layer 172 may be disposed between the second single-layered gate 162 and the second selection gate main line 181b. The first single-layered gate 161, the first dielectric layer 171 and the first selection gate main line 181a may constitute a first capacitor C1, and the second single-layered gate 162, the second dielectric layer 172 and the second selection gate main line 181b may constitute a second capacitor C2. Accordingly, a coupling voltage may be induced at the first single-layered gate 161 due to the first capacitor C1 when a predetermined voltage is applied to the first selection gate main line 181a, and a coupling voltage may also be induced at the second single-layered gate 162 due to the second capacitor C2 when a predetermined voltage is applied to the second selection gate main line 181b. In some embodiments, a dielectric constant of the first dielectric layer 171 may substantially equal the dielectric constant of the second dielectric layer 172.

The sidewall contact area between the first dielectric layer 171 and the first single-layered gate 161, or between the first dielectric layer 171 and the first selection gate main line 181a, may substantially equal the sidewall contact area between the second dielectric layer 172 and the second single-layered gate 162, or between the second dielectric layer 172 and the second selection gate main line 181b. In addition, a thickness of the first dielectric layer 171 in the first direction may be equal to a thickness of the second dielectric layer 172 in the first direction. The coupling ratio at the first single-layered gate 161, which denotes a capacitance of the first capacitor C1, may be substantially equal to a coupling ratio at the second single-layered gate 162, which denotes a capacitance of the second capacitor C2. Thus, when the same voltage is applied to the first and second selection gate main lines 181a and 181b, a coupling voltage induced at the first single-layered gate 161 by the first capacitor C1 may be substantially equal to a coupling voltage induced at the second single-layered gate 162 by the first capacitor C2.

As illustrated in FIG. 3, a third dielectric layer 173 may be disposed between the first single-layered gate 161 and the selection gate extension 183, and a fourth dielectric layer 174 may be disposed between the second single-layered gate 162 and the selection gate extension 183. The first single-layered gate 161, the third dielectric layer 173 and the selection gate extension 183 may constitute a third capacitor C3, and the second single-layered gate 162, the fourth dielectric layer 174 and the selection gate extension 183 may constitute a fourth capacitor C4. Accordingly, a coupling voltage induced at the first single-layered gate 161 may be determined by a voltage applied to the selection gate extension 183 and a capacitive coupling of the third capacitor C3 in addition to the first capacitor C1, and a coupling voltage induced at the second single-layered gate 162 may be determined by a voltage applied to the selection gate extension 183 and a capacitive coupling of the fourth capacitor C4 in addition to the second capacitor C2. In some embodiments, a dielectric constant of the third dielectric layer 173 may be substantially equal to a dielectric constant of the fourth dielectric layer 174.

The first capacitor C1 and the third capacitor C3 may be connected in parallel between the first single-layered gate 161 and the selection gate 180. Similarly, the second capacitor C2 and the fourth capacitor C4 may be connected in parallel between the second single-layered gate 162 and the selection gate 180. Thus, a coupling voltage induced at the first single-layered gate 161 may be determined by a sum of capacitances of the first and third capacitors C1 and C3, and a coupling voltage induced at the second single-layered gate 162 may be determined by a sum of capacitances of the second and fourth capacitors C2 and C4.

The sidewall contact area between the third dielectric layer 173 and the first single-layered gate 161, or between the third dielectric layer 173 and the selection gate extension 183, may be substantially equal to the sidewall contact area between the fourth dielectric layer 174 and the second single-layered gate 162, or between the fourth dielectric layer 174 and the selection gate extension 183. In addition, a thickness of the third dielectric layer 173 in the first direction may be equal to a thickness of the fourth dielectric layer 174 in the first direction. A coupling ratio at the first single-layered gate 161, which denotes a capacitance of the third capacitor C3, may be substantially equal to a coupling ratio at the second single-layered gate 162, which denotes a capacitance of the fourth capacitor C4. That is, a coupling voltage induced at the first single-layered gate 161 by a capacitive coupling of the third capacitor C3 may be substantially equal to a coupling voltage induced at the second single-layered gate 162 by a capacitive coupling of the fourth capacitor C4. In some embodiments, a thickness of each of the third and fourth dielectric layers 173 and 174 in the first direction may be less than a thickness of each of the first and second dielectric layers 171 and 172 in the first direction.

Referring again to FIGS. 1 to 3, the first impurity junction region 141 may be electrically connected to a source line SL through a first contact 191. Moreover, the second and third impurity junction regions 142 and 143 may be electrically connected to a bit line BL in common through a second contact 192 and a third contact 193, respectively. The selection gate 180 may be electrically connected to a word line WL through a fourth contact 194.

Figure 4:
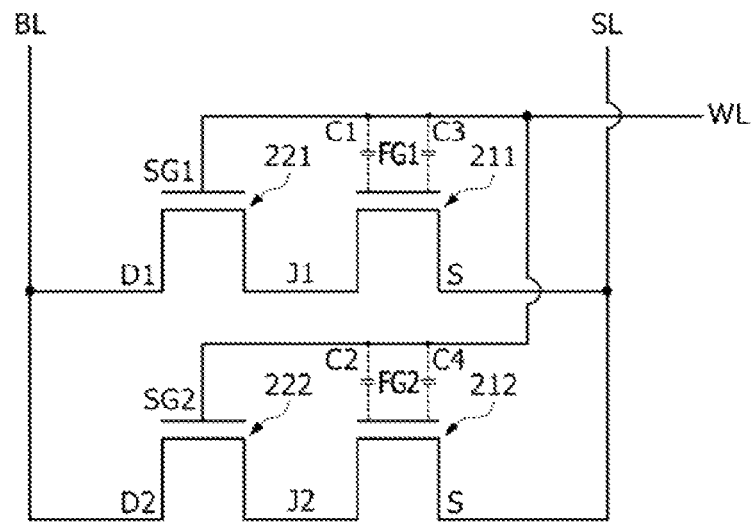
FIG. 4 is an equivalent circuit of the unit cell shown in FIG. 1.

FIG. 4 is an equivalent circuit of the unit cell 100 shown in FIG. 1.

Referring to FIGS. 1 to 4, the unit cell 100 may be configured to include a first storage transistor 211, a second storage transistor 212, a first selection transistor 221 and a second selection transistor 222. The first storage transistor 211 may include a first floating gate FG1 which is electrically isolated, and the second storage transistor 212 may include a second floating gate FG2 which is electrically isolated. The first and second floating gates FG1 and FG2 may correspond to the first and second single-layered gates 161 and 162, respectively. The first selection transistor 221 may include a first selection gate terminal SG1, and the second selection transistor 222 may include a second selection gate terminal SG2. The first and second selection gate terminals SG1 and SG2 may correspond to the first and second selection gate main lines 181a and 181b, respectively. The first and second selection gate terminals SG1 and SG2 of the first and second selection transistors 221 and 222 may be electrically connected in common to the word line WL.

The first storage transistor 211 may be coupled between a common source terminal S and a first connection terminal J1. The second storage transistor 212 may be coupled between the common source terminal S and a second connection terminal J2. The common source terminal S may correspond to the first impurity junction region 141, and the first storage transistor 211 may share the common source terminal S with the second storage transistor 212. The common source terminal S may be electrically connected to the source line SL. The first connection terminal J1 may correspond to the fourth impurity junction region 144. The first storage transistor 211 may share the first connection terminal J1 with the first selection transistor 221. The second connection terminal J2 may correspond to the fifth impurity junction region 145. The second storage transistor 212 may share the second connection terminal J2 with the second selection transistor 222.

The first selection transistor 221 may be coupled between a first drain terminal D1 and the first connection terminal J1. The first drain terminal D1 may correspond to the second impurity junction region 142. The second selection transistor 222 may be coupled between a second drain terminal D2 and the second connection terminal J2. The second drain terminal D2 may correspond to the third impurity junction region 143. The first and second drain terminals D1 and D2 of the first and second selection transistors 221 and 222 may be electrically connected to the bit line BL in common.

The first and third capacitors C1 and C3 corresponding to parasitic capacitive components may be provided between the word line WL and the first floating gate FG1 and may be coupled in parallel between the word line WL and the first floating gate FG1. Thus, when a certain voltage is applied to the word line WL, a coupling voltage may be induced at the first floating gate FG1 by capacitive coupling of the first and third capacitors C1 and C3. The second and fourth capacitors C2 and C4 corresponding to parasitic capacitive components may be provided between the word line WL and the second floating gate FG2 and may be coupled in parallel between the word line WL and the second floating gate FG2. Thus, when a certain voltage is applied to the word line WL, a coupling voltage may be induced at the second floating gate FG2 by capacitive coupling of the second and fourth capacitors C2 and C4.

Figure 5:
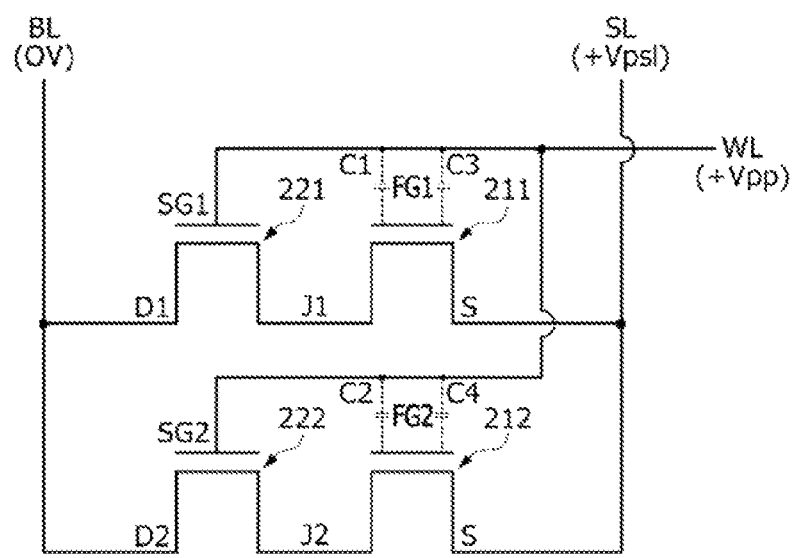
FIG. 5 is a circuit diagram illustrating a program operation of the unit cell shown in FIG. 4.

FIG. 5 is a circuit diagram illustrating a program operation of the unit cell shown in FIG. 4. The program operation according to the present embodiment may be performed by a hot carrier injection mechanism.

Referring to FIGS. 2, 3 and 5, a positive program voltage +Vpp and a positive program source line voltage +Vpsl may be respectively applied to the word line WL and the source line SL to program the unit cell. In addition, the bit line BL may be grounded to program the unit cell. Although not shown in the drawings, bodies (e.g., the substrate 110) of the first and second storage transistors 211 and 212 and the first and second selection transistors 221 and 222 may also be grounded to program the unit cell. In some embodiments, the positive program voltage +Vpp may be about 8 V, and the positive program source line voltage +Vpsl may be about 4 V.

The positive program voltage +Vpp may be applied to the first and second selection gate terminals SG1 and SG2, i.e., the first and second selection gate main lines 181a and 181b, through the word line WL, thereby turning on the first and second selection transistors 221 and 222. When the first and second selection transistors 221 and 222 are turned on, an electric potential (i.e., a ground voltage) applied to the bit line BL may be transmitted to the first and second connection terminals J1 and J2, i.e., the fourth and fifth impurity junction regions 144 and 145, through the first and second drain terminals D1 and D2, i.e., the second and third impurity junction regions 142 and 143.

When the positive program voltage +Vpp is applied to the word line WL, a coupling voltage may be induced at the first floating gate FG1, i.e., the first single-layered gate 161, by a capacitive coupling of the first and third capacitors C1 and C3, as described with reference to FIGS. 2 and 3. Similarly, when the positive program voltage +Vpp is applied to the word line WL, a coupling voltage may also be induced at the second floating gate FG2, i.e., the second single-layered gate 162, by capacitive coupling of the second and fourth capacitors C2 and C4, as described with reference to FIGS. 2 and 3. The first storage transistor 211 may be turned on or off in response to a threshold voltage thereof and the coupling voltage induced at the first floating gate FG1, and the second storage transistor 212 may be turned on or off in response to a threshold voltage thereof and the coupling voltage induced at the second floating gate FG2.

When the first storage transistor 211 is turned on, an inversion channel may be formed between the common source terminal S and the first connection terminal J1, i.e., the first impurity junction region 141 and the fourth impurity junction region 144. Because the positive program source line voltage +Vpsl applied to the common source terminal S is higher than the ground voltage applied to the first connection terminal J1, the inversion channel of the first storage transistor 211 may be pinched off at the vicinity of the common source terminal S, i.e., the first impurity junction region 141, to create a strong horizontal electric field between the inversion channel and the first impurity junction region 141.

Similarly, when the second storage transistor 212 is turned on, an inversion channel may also be formed between the common source terminal S and the second connection terminal J2, i.e., the first impurity junction region 141 and the fifth impurity junction region 145. Because the positive program source line voltage +Vpsl applied to the common source terminal S is higher than the ground voltage applied to the second connection terminal J2, the inversion channel of the second storage transistor 212 may be pinched off at the vicinity of the common source terminal S, i.e., the first impurity junction region 141, to create a strong horizontal electric field between the inversion channel and the first impurity junction region 141.

Hot electrons may be generated at the vicinity of the common source terminal S, i.e., the first impurity junction region 141, due to the strong horizontal electric field between the inversion channel of the first storage transistor 211 and the first impurity junction region 141, and the hot electrons may be injected into the first floating gate FG1, i.e., the first single-layered gate 161, through the first gate insulation layer 151 due to a vertical electric field which is created by a coupling voltage induced at the first floating gate terminal FG1, i.e., the first single-layered gate 161. As a result, the first storage transistor 211 may be programmed. Similarly, hot electrons may be generated at the vicinity of the common source terminal S, i.e., the first impurity junction region 141, due to the strong horizontal electric field between the inversion channel of the second storage transistor 212 and the first impurity junction region 141, and the hot electrons may be injected into the second floating gate FG2, i.e., the second single-layered gate 162, through the second gate insulation layer 152 due to a vertical electric field which is created by a coupling voltage induced at the second floating gate terminal FG2, i.e., the second single-layered gate 162. As a result, the second storage transistor 212 may be programmed.

Figure 6:
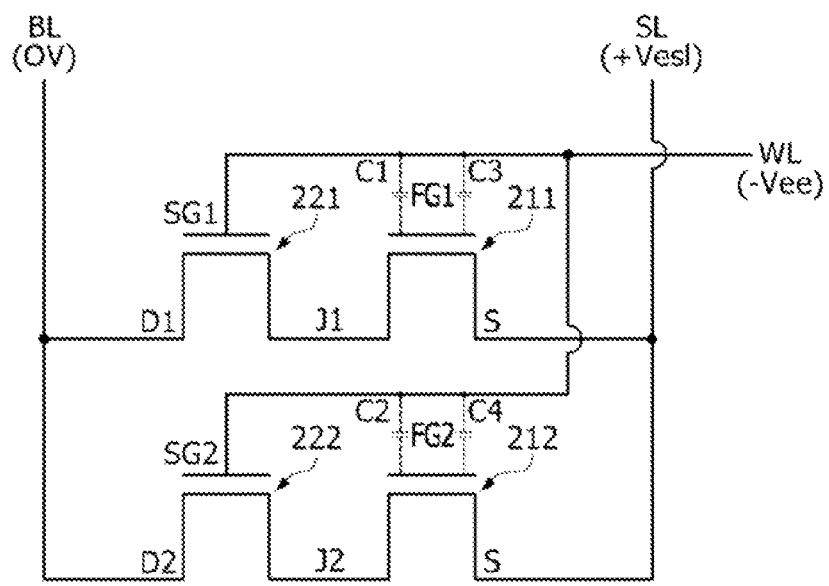
FIG. 6 is a circuit diagram illustrating an erasure operation of the unit cell shown in FIG. 4.

FIG. 6 is a circuit diagram illustrating an erasure operation of the unit cell shown in FIG. 4. The erasure operation according to the present embodiment may be performed by a band-to-band tunneling (BTBT) mechanism.

Referring to FIGS. 2, 3 and 6, a negative erasure voltage −Vee and a positive erasure source line voltage +Vesl may be respectively applied to the word line WL and the source line SL to erase the data stored in the unit cell. In addition, the bit line BL may be grounded to erase the data stored in the unit cell. Although not shown in the drawings, bodies (e.g., the substrate 110) of the first and second storage transistors 211 and 212 and the first and second selection transistors 221 and 222 may also be grounded to erase the data stored in the unit cell. In some embodiments, the negative erasure voltage −Vee may be about −8 V, and the positive erasure source line voltage +Vesl may be about 5.5 V.

When the negative erasure voltage −Vee is applied to the word line WL, a negative coupling voltage may be induced at the first floating gate FG1, i.e., the first single-layered gate 161, by capacitive coupling of the first and third capacitors C1 and C3, as described with reference to FIGS. 2 and 3. Similarly, when the negative erasure voltage −Vee is applied to the word line WL, a negative coupling voltage may also be induced at the second floating gate FG2, i.e., the second single-layered gate 162, by capacitive coupling of the second and fourth capacitors C2 and C4, as described with reference to FIGS. 2 and 3. When a negative coupling voltage is induced at the first floating gate FG1, i.e., the first single-layered gate 161, and the positive erasure source line voltage +Vesl is applied to the common source terminal S, i.e., the first impurity junction region 141, through the source line SL, the electrons stored in the first floating gate FG1, i.e., the first single-layered gate 161, may be injected into the common source terminal S, i.e., the first impurity junction region 141, through the first gate insulation layer 151. As a result, the first storage transistor 211 may be erased. Similarly, when a negative coupling voltage is induced at the second floating gate FG2, i.e., the second single-layered gate 162, and the positive erasure source line voltage +Vesl is applied to the common source terminal S, i.e., the first impurity junction region 141, through the source line SL, the electrons stored in the second floating gate FG2, i.e., the second single-layered gate 162, may be injected into the common source terminal S, i.e., the first impurity junction region 141, through the second gate insulation layer 152. As a result, the second storage transistor 212 may be erased.

Figure 7:
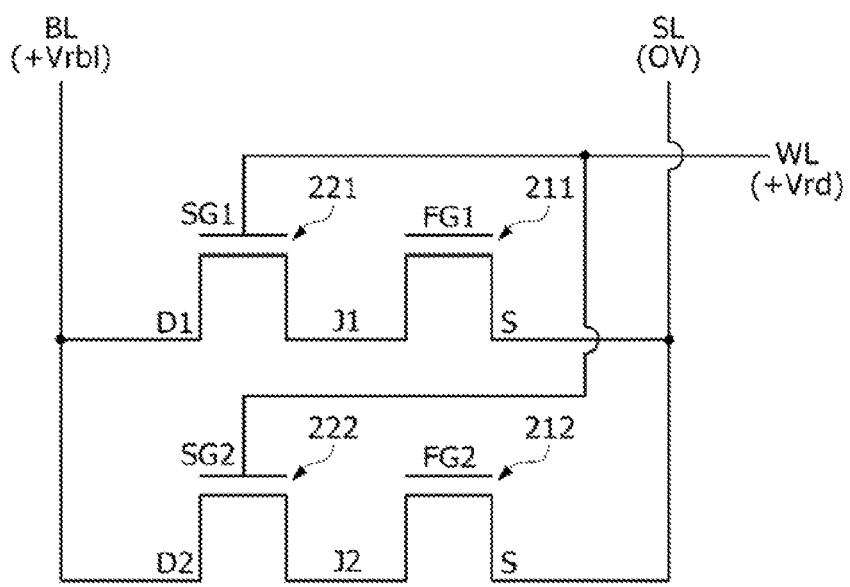
FIG. 7 is a circuit diagram illustrating a read operation of the unit cell shown in FIG. 4.

FIG. 7 is a circuit diagram illustrating a read operation of the unit cell shown in FIG. 4.

Referring to FIGS. 2, 3 and 7, a positive read voltage +Vrd and a positive read bit line voltage +Vrbl may be respectively applied to the word line WL and the bit line BL to read out the data stored in the unit cell. In addition, the source line SL may be grounded to read out the data stored in the unit cell. Although not shown in the drawings, bodies (e.g., the substrate 110) of the first and second storage transistors 211 and 212 and the first and second selection transistors 221 and 222 may also be grounded to read out the data stored in the unit cell. In some embodiments, the positive read voltage +Vrd may be about 3.3 V, and the positive read bit line voltage +Vrbl may be about 1.0 V.

When the positive read voltage +Vrd is applied to the first and second selection gate terminals SG1 and SG2, i.e., the first and second selection gate main lines 181a and 181b, through the word line WL, the first and second selection transistors 221 and 222 may be turned on. When the first selection transistor 221 is turned on, an electric potential of the positive read bit line voltage +Vrbl applied to the bit line BL may be transmitted to the first connection terminal J1, i.e., the fourth impurity junction region 144, through the first drain terminal D1, i.e., the second impurity junction region 142. Similarly, when the second selection transistor 222 is turned on, an electric potential of the positive read bit line voltage +Vrbl applied to the bit line BL may be transmitted to the second connection terminal J2, i.e., the fifth impurity junction region 145, through the second drain terminal D2, i.e., the third impurity junction region 143.

When the positive read voltage +Vrd is applied to the word line WL, a coupling voltage may be induced at the first floating gate FG1, i.e., the first single-layered gate 161, by capacitive coupling of the first and third capacitors C1 and C3, as described with reference to FIGS. 2 and 3. Similarly, when the positive read voltage +Vrd is applied to the word line WL, a coupling voltage may be induced at the second floating gate FG2, i.e., the second single-layered gate 162, by capacitive coupling of the second and fourth capacitors C2 and C4, as described with reference to FIGS. 2 and 3. The first storage transistor 211 may be turned on or off in response to a threshold voltage thereof, and the second storage transistor 212 may be turned on or off in response to a threshold voltage thereof. For example, when the first storage transistor 211 is programmed to have a threshold voltage which is higher than the coupling voltage induced at the first floating gate FG1, i.e., the first single-layered gate 161, the first storage transistor 211 may be turned off. In this case, no bit line current may flow through the first storage transistor 211 even though the first selection transistor 221 is turned on. In contrast, when the first storage transistor 211 is erased to have a threshold voltage which is lower than the coupling voltage induced at the first floating gate FG1, i.e., the first single-layered gate 161, the first storage transistor 211 may be turned on. In this case, bit line current may flow through the first storage transistor 211 when the first selection transistor 221 is turned on.

Similarly, when the second storage transistor 212 is programmed to have a threshold voltage which is higher than the coupling voltage induced at the second floating gate FG2, i.e., the second single-layered gate 162, the second storage transistor 212 may be turned off. In this case, no bit line current may flow through the second storage transistor 212 even though the second selection transistor 222 is turned on. In contrast, when the second storage transistor 212 is erased and has a threshold voltage which is lower than the coupling voltage induced at the second floating gate FG2, i.e., the second single-layered gate 162, the second storage transistor 212 may be turned on. Therefore, bit line current may flow through the second storage transistor 212 when the second selection transistor 222 is turned on.

Figure 8:
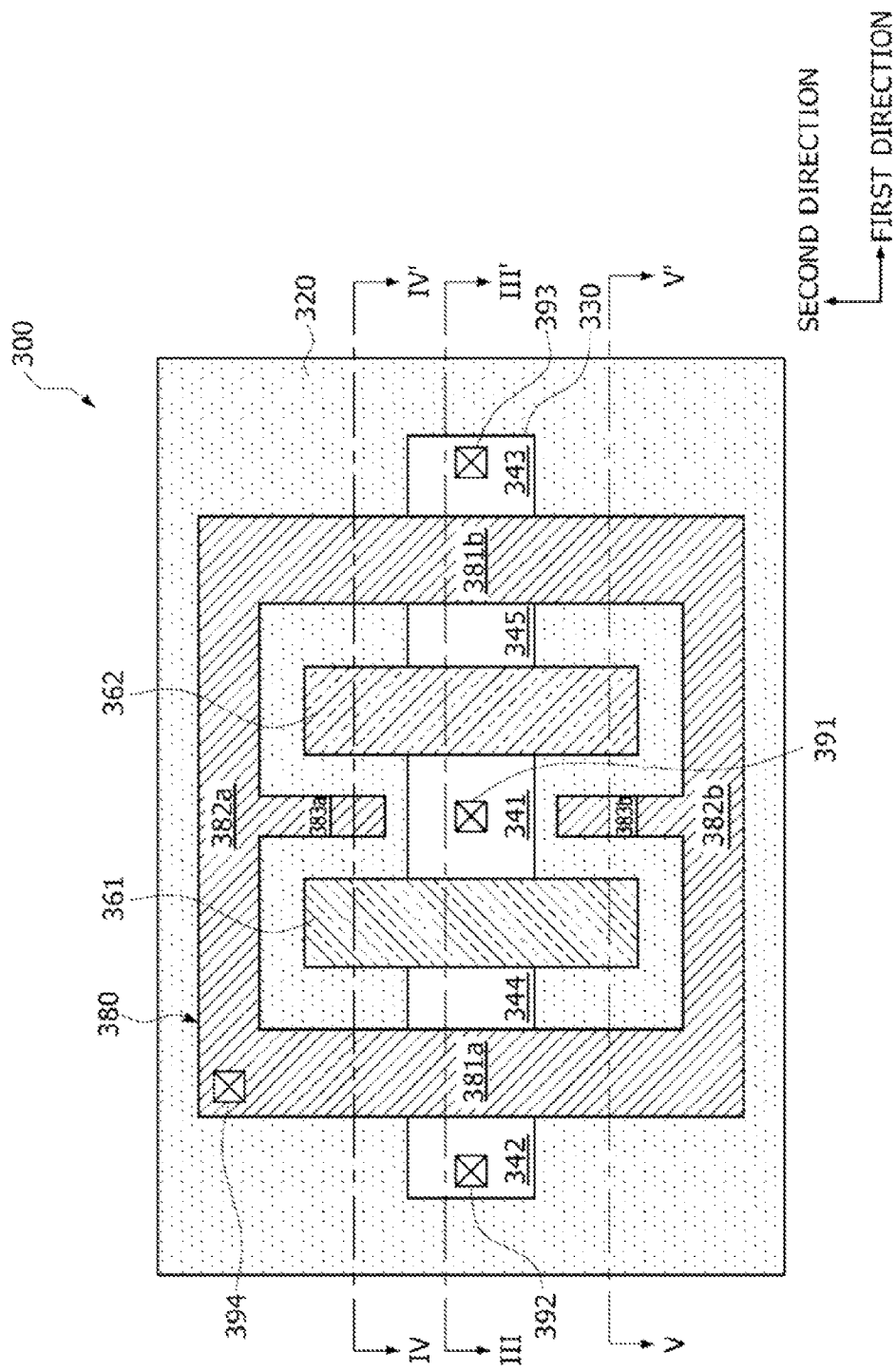
FIG. 8 is a layout diagram illustrating a unit cell of a nonvolatile memory device according to another embodiment.
Figure 9:
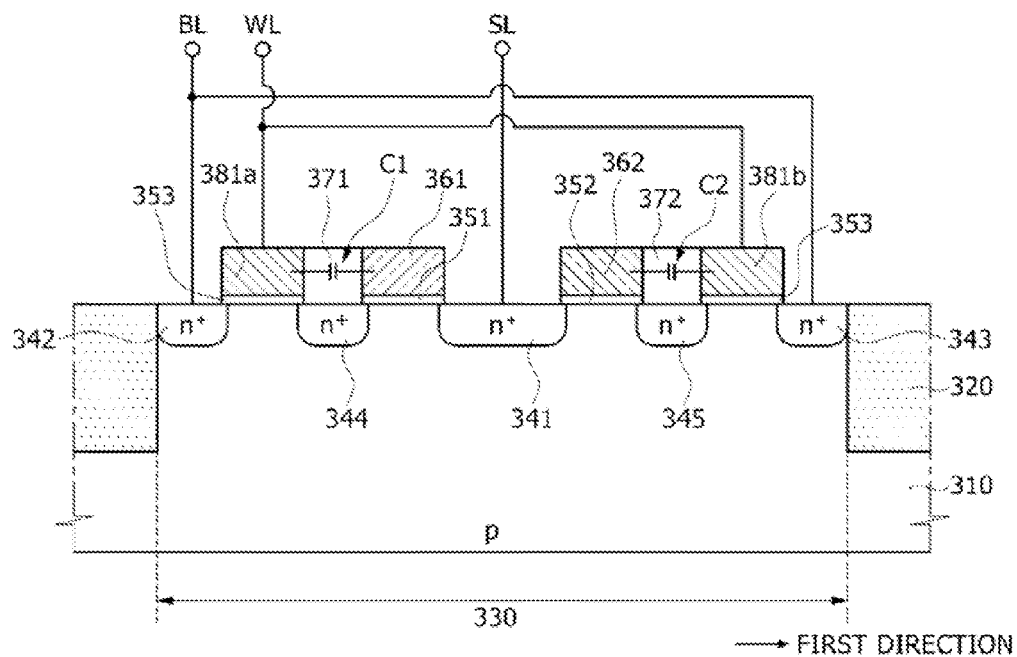
FIG. 9 is a cross-sectional view taken along a line III-III' of FIG. 8.
Figure 10:
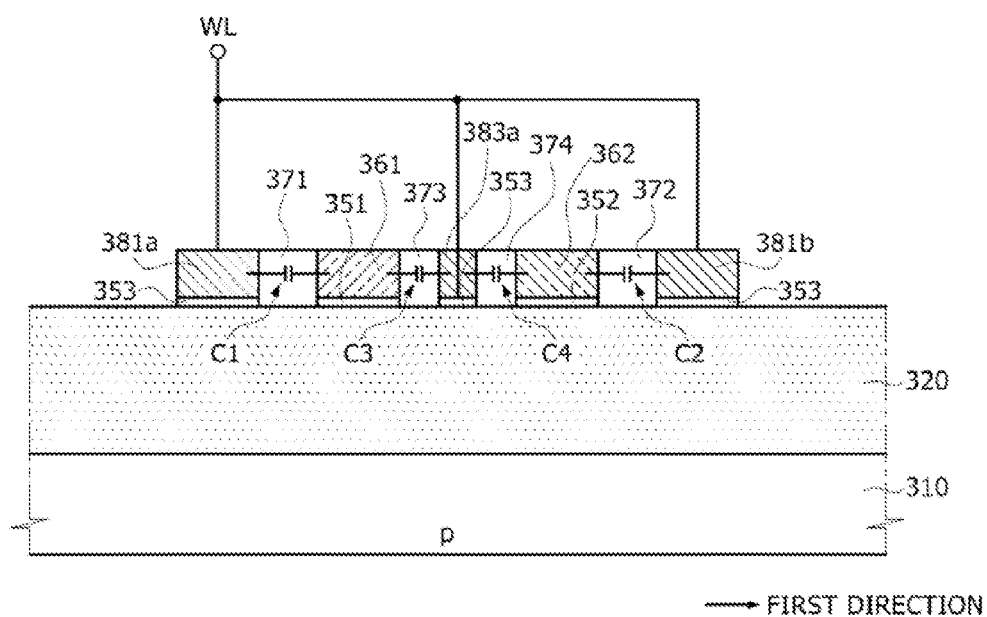
FIG. 10 is a cross-sectional view taken along a line IV-IV' of FIG. 8.
Figure 11:
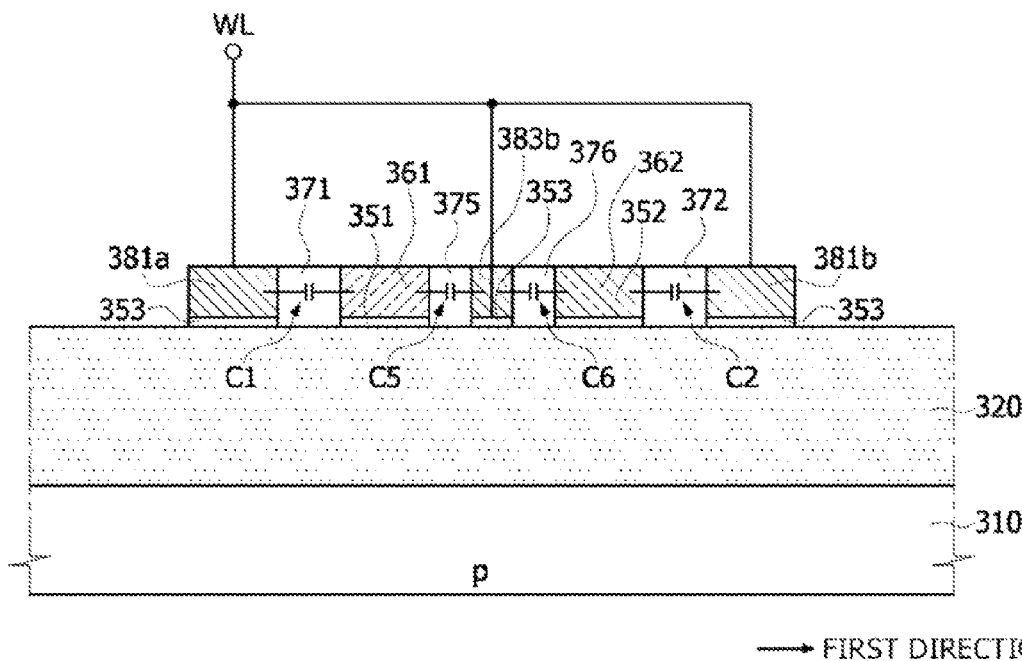
FIG. 11 is a cross-sectional view taken along a line V-V' of FIG. 8.

FIG. 8 is a layout diagram illustrating a unit cell 300 of a nonvolatile memory device according to another embodiment. FIGS. 9 to 11 are cross-sectional views taken along lines III-III', IV-IV' and V-V' of FIG. 8, respectively.

Referring to FIGS. 8 to 11, the unit cell 300 may include an active region 330 that is defined by an isolation layer 320 formed in a substrate 310. In some embodiments, the substrate 310 may be a single crystalline silicon substrate. Alternatively, the substrate 310 may be a semiconductor substrate other than a silicon substrate. In some other embodiments, the substrate 310 may be a silicon-on-insulator (SOI) substrate including a support substrate, a buried insulation layer and a single crystalline silicon layer, which are sequentially stacked. When the substrate 310 includes a semiconductor substrate or a semiconductor layer, the semiconductor substrate or the semiconductor layer may have a first conductivity type, for example, P-type conductivity. When the substrate 310 has a second conductivity type, i.e., N-type conductivity, which is opposite to the first conductivity, a well region having the first conductivity type may be disposed in the substrate 310. The active region 330 may extend in a first direction. In the present embodiment, the first direction may be an arbitrary direction, and a second direction may be substantially perpendicular to the first direction.

A first impurity junction region 341, a second impurity junction region 342, a third impurity junction region 343, a fourth impurity junction region 344 and a fifth impurity junction region 345 may be disposed in an upper region of the active region 330 to be spaced apart from each other along the first direction. In some embodiments, the first impurity junction region 341 may act as a common source region, and the second and third impurity junction regions 342 and 343 may act as drain regions. All of the first to fifth impurity junction regions 341 to 345 may be heavily doped with impurities of the second conductivity type, for example, N-type impurities. The first impurity junction region 341 may be disposed in a central region of the active region 330. The second and third impurity junction regions 342 and 343 may be disposed in both ends of the active region 330, respectively. The fourth impurity junction region 344 may be disposed between the first and second impurity junction regions 341 and 342, and the fifth impurity junction region 345 may be disposed between the first and third impurity junction regions 341 and 343.

A first gate insulation layer 351 and a first single-layered gate 361 may be sequentially stacked on the active region 330 between the first and fourth impurity junction regions 341 and 344. A second gate insulation layer 352 and a second single-layered gate 362 may be sequentially stacked on the active region 330 between the first and fifth impurity junction regions 341 and 345. In some embodiments, each of the first and second gate insulation layers 351 and 352 may include a silicon oxide layer, and each of the first and second single-layered gates 361 and 362 may include a polysilicon layer. The first impurity junction region 341 may be exposed by a space between the first and second single-layered gates 361 and 362. As illustrated in FIG. 8, the first and second single-layered gates 361 and 362 may be disposed to intersect the active region 330 and to extend in the second direction. Thus, a portion of the first single-layered gate 361 may overlap with the active region 330, and the remaining portion of the first single-layered gate 361 may overlap with the isolation layer 320. Similarly, a portion of the second single-layered gate 362 may overlap with the active region 330, and the remaining portion of the second single-layered gate 362 may overlap with the isolation layer 320.

A selection gate 380 may include a first selection gate main line 381a, a second selection gate main line 381b, a first selection gate interconnection line 382a, a second selection gate interconnection line 382b, a first selection gate extension 383a and a second selection gate extension 383b. A third gate insulation layer 353 may be disposed between the selection gate 380 and the substrate 310. That is, the third gate insulation layer 353 may be disposed between the selection gate 380 and the active region 330, and between the selection gate 380 and the isolation layer 320. In some embodiments, the third gate insulation layer 353 may include a silicon oxide layer, and the selection gate 380 may include a polysilicon layer.

The first selection gate main line 381a may be disposed to overlap with the active region 330 between the second and fourth impurity junction regions 342 and 344. Specifically, the first selection gate main line 381a may intersect the active region 330 and may extend in the second direction to be parallel with the first single-layered gate 361. The first selection gate main line 381a may be disposed at one side of the first single-layered gate 361 opposite to the second single-layered gate 362. The second selection gate main line 381b may be disposed to overlap with the active region 330 between the third and fifth impurity junction regions 343 and 345. Specifically, the second selection gate main line 381b may intersect the active region 330 and may extend in the second direction to be parallel with the second single-layered gate 362. The second selection gate main line 381b may be disposed at one side of the second single-layered gate 362 opposite to the first single-layered gate 361.

The first selection gate interconnection line 382a may connect a first end of the first selection gate main line 381a to a first end of the second selection gate main line 381b. The first selection gate interconnection line 382a may be disposed at a first side of the active region 330. As illustrated in FIG. 8, the first selection gate interconnection line 382a may not overlap with the active region 330 but overlap with the isolation layer 320. The first selection gate interconnection line 382a may extend parallel to the active region, i.e., in the first direction, to have a stripe or line shape. The first selection gate interconnection line 382a may be spaced apart from the first and second single-layered gates 361 and 362 by a certain distance.

The second selection gate interconnection line 382b may connect a second end of the first selection gate main line 381a to a second end of the second selection gate main line 381b. The second selection gate interconnection line 382b may be disposed at a second side of the active region 330 opposite to the first selection gate interconnection line 382a. As illustrated in FIG. 8, the second selection gate interconnection line 382b may not overlap with the active region 330 but overlap with the isolation layer 320. The second selection gate interconnection line 382b may extend parallel to the first selection gate interconnection line 382a and the active region, i.e., in the first direction to have a stripe or line shape. The second selection gate interconnection line 382b may be spaced apart from the first and second single-layered gates 361 and 362 by a certain distance.

The first selection gate extension 383a may extend from a portion of a sidewall of the first selection gate interconnection line 382a to have a certain length. As illustrated in FIG. 8, the first selection gate extension 383a may extend in an opposite direction to the second direction. That is, the first selection gate extension 383a may extend perpendicular to the first selection gate interconnection line 382a, i.e., from the first selection gate interconnection line 382a toward the active region 330. Thus, the first selection gate extension 383a may be disposed between the first and second single-layered gates 361 and 362. Accordingly, an end of the first selection gate extension 383a may be adjacent to the active region 330. The first selection gate extension 383a may not overlap with the active region 330 but overlap with the isolation layer 320.

The second selection gate extension 383b may extend from a portion of a sidewall of the second selection gate interconnection line 382b to have a certain length. As illustrated in FIG. 8, the second selection gate extension 383b may extend in the second direction. That is, the second selection gate extension 383b may extend perpendicular to the second selection gate interconnection line 382b, i.e., from the second selection gate interconnection line 382b toward the active region 330. Thus, the second selection gate extension 383b may be disposed between the first and second single-layered gates 361 and 362. Accordingly, an end of the second selection gate extension 383b may be adjacent to the active region 330. The second selection gate extension 383b may not overlap with the active region 330 but overlap with the isolation layer 320.

As illustrated in FIGS. 9 to 11, a first dielectric layer 371 may be disposed between the first single-layered gate 361 and the first selection gate main line 381a, and a second dielectric layer 372 may be disposed between the second single-layered gate 362 and the second selection gate main line 381b. The first single-layered gate 361, the first dielectric layer 371 and the first selection gate main line 381a may constitute a first capacitor C1, and the second single-layered gate 362, the second dielectric layer 372 and the second selection gate main line 381b may constitute a second capacitor C2. Accordingly, a coupling voltage may be induced at the first single-layered gate 361 due to the first capacitor C1 when a predetermined voltage is applied to the first selection gate main line 381a, and a coupling voltage may also be induced at the second single-layered gate 362 due to the second capacitor C2 when a predetermined voltage is applied to the second selection gate main line 381b. In some embodiments, a dielectric constant of the first dielectric layer 371 may be substantially equal to a dielectric constant of the second dielectric layer 372.

The sidewall contact area between the first dielectric layer 371 and the first single-layered gate 361, or between the first dielectric layer 371 and the first selection gate main line 381a, may be substantially equal to the sidewall contact area between the second dielectric layer 372 and the second single-layered gate 362, or between the first dielectric layer 371 and the second selection gate main line 381b. In addition, a thickness of the first dielectric layer 371 in the first direction may be equal to a thickness of the second dielectric layer 372 in the first direction. The coupling ratio at the first single-layered gate 361, which denotes a capacitance of the first capacitor C1, may be substantially equal to a coupling ratio at the second single-layered gate 362, which denotes a capacitance of the second capacitor C2. Thus, when the same voltage is applied to the first and second selection gate main lines 381a and 381b, a coupling voltage induced at the first single-layered gate 361 by the first capacitor C1 may be substantially equal to a coupling voltage induced at the second single-layered gate 362 by the first capacitor C2.

As illustrated in FIG. 10, a third dielectric layer 373 may be disposed between the first single-layered gate 361 and the first selection gate extension 383a, and a fourth dielectric layer 374 may be disposed between the second single-layered gate 362 and the first selection gate extension 383a. The first single-layered gate 361, the third dielectric layer 373 and the first selection gate extension 383a may constitute a third capacitor C3, and the second single-layered gate 362, the fourth dielectric layer 374 and the first selection gate extension 383a may constitute a fourth capacitor C4. Accordingly, a coupling voltage induced at the first single-layered gate 361 may be determined by a voltage applied to the first selection gate extension 383a and capacitive coupling of the third capacitor C3 in addition to the first capacitor C1, and a coupling voltage induced at the second single-layered gate 362 may be determined by a voltage applied to the first selection gate extension 383a and capacitive coupling of the fourth capacitor C4 in addition to the second capacitor C2. In some embodiments, a dielectric constant of the third dielectric layer 373 may be substantially equal to a dielectric constant of the fourth dielectric layer 374.

As illustrated in FIG. 11, a fifth dielectric layer 375 may be disposed between the first single-layered gate 361 and the second selection gate extension 383b, and a sixth dielectric layer 376 may be disposed between the second single-layered gate 362 and the second selection gate extension 383b. The first single-layered gate 361, the fifth dielectric layer 375 and the second selection gate extension 383b may constitute a fifth capacitor C5, and the second single-layered gate 362, the sixth dielectric layer 376 and the second selection gate extension 383b may constitute a sixth capacitor C6. Accordingly, a coupling voltage induced at the first single-layered gate 361 may be determined by a voltage applied to the second selection gate extension 383b and capacitive coupling of the fifth capacitor C5 in addition to the first capacitor C1, and a coupling voltage induced at the second single-layered gate 362 may be determined by a voltage applied to the second selection gate extension 383b and capacitive coupling of the sixth capacitor C6 in addition to the second capacitor C2. In some embodiments, a dielectric constant of the fifth dielectric layer 375 may be substantially equal to a dielectric constant of the sixth dielectric layer 376.

The first capacitor C1, the third capacitor C3 and the fifth capacitor C5 may be connected in parallel between the first single-layered gate 361 and the selection gate 380. Similarly, the second capacitor C2, the fourth capacitor C4 and the sixth capacitor C6 may be connected in parallel between the second single-layered gate 362 and the selection gate 380. Thus, a coupling voltage induced at the first single-layered gate 361 may be determined by a sum of capacitances of the first, third and fifth capacitors C1, C3 and C5, and a coupling voltage induced at the second single-layered gate 362 may be determined by a sum of capacitances of the second, fourth and sixth capacitors C2, C4 and C6.

The sidewall contact area between the third dielectric layer 373 and the first single-layered gate 361, or between the third dielectric layer 373 and the first selection gate extension 383a, may be substantially equal to the sidewall contact area between the fourth dielectric layer 374 and the second single-layered gate 362, or between the fourth dielectric layer 374 and the first selection gate extension 383a. In addition, a thickness of the third dielectric layer 373 in the first direction may be equal to a thickness of the fourth dielectric layer 374 in the first direction. The coupling ratio at the first single-layered gate 361, which denotes a capacitance of the third capacitor C3, may be substantially equal to the coupling ratio at the second single-layered gate 362, which denotes a capacitance of the fourth capacitor C4. That is, a coupling voltage induced at the first single-layered gate 361 by capacitive coupling of the third capacitor C3 may be substantially equal to a coupling voltage induced at the second single-layered gate 362 by capacitive coupling of the fourth capacitor C4.

The sidewall contact area between the fifth dielectric layer 375 and the first single-layered gate 361 or between the fifth dielectric layer 375 and the second selection gate extension 383b, may be substantially equal to the sidewall contact area between the sixth dielectric layer 376 and the second single-layered gate 362 or between the sixth dielectric layer 376 and the second selection gate extension 383b. In addition, a thickness of the fifth dielectric layer 375 in the first direction may be equal to a thickness of the sixth dielectric layer 376 in the first direction. The coupling ratio at the first single-layered gate 361, which denotes a capacitance of the fifth capacitor C5, may be substantially equal to a coupling ratio at the second single-layered gate 362, which denotes a capacitance of the sixth capacitor C6. That is, a coupling voltage induced at the first single-layered gate 361 by capacitive coupling of the fifth capacitor C5 may be substantially equal to a coupling voltage induced at the second single-layered gate 362 by capacitive coupling of the sixth capacitor C6. In some embodiments, the thickness of each of the third to sixth dielectric layers 373 to 376 in the first direction may be less than the thickness of each of the first and second dielectric layers 371 and 372 in the first direction.

Referring again to FIGS. 8 to 11, the first impurity junction region 341 may be electrically connected to a source line SL through a first contact 391. Moreover, the second and third impurity junction regions 342 and 343 may be electrically connected to a bit line BL in common through a second contact 392 and a third contact 393, respectively. The selection gate 380 may be electrically connected to a word line WL through a fourth contact 394.

Figure 12:
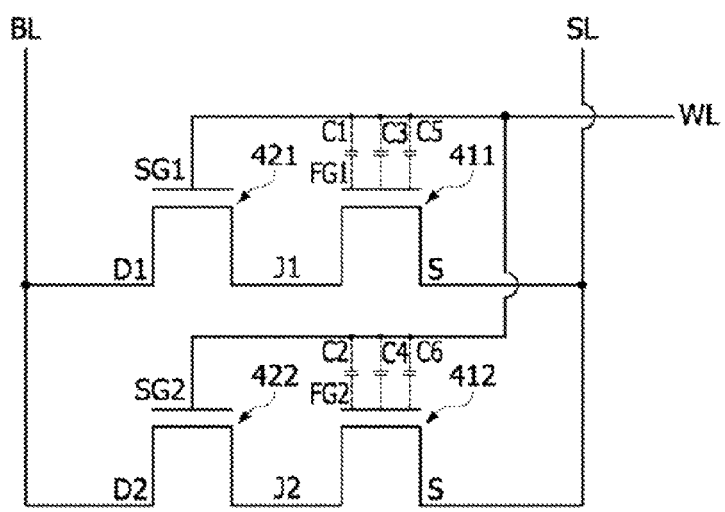
FIG. 12 is an equivalent circuit of the unit cell shown in FIG. 8.

FIG. 12 is an equivalent circuit of the unit cell 300 shown in FIG. 8.

Referring to FIGS. 8 to 12, the unit cell 300 may be configured to include a first storage transistor 411, a second storage transistor 412, a first selection transistor 421 and a second selection transistor 422. The first storage transistor 411 may include a first floating gate FG1 which is electrically isolated, and the second storage transistor 412 may include a second floating gate FG2 which is electrically isolated. The first and second floating gates FG1 and FG2 may correspond to the first and second single-layered gates 361 and 362, respectively. The first selection transistor 421 may include a first selection gate terminal SG1, and the second selection transistor 422 may include a second selection gate terminal SG2. The first and second selection gate terminals SG1 and SG2 may correspond to the first and second selection gate main lines 381a and 381b, respectively. The first and second selection gate terminals SG1 and SG2 of the first and second selection transistors 421 and 422 may be electrically connected in common to the word line WL.

The first storage transistor 411 may be coupled between a common source terminal S and a first connection terminal J1. The second storage transistor 412 may be coupled between the common source terminal S and a second connection terminal J2. The common source terminal S may correspond to the first impurity junction region 341, and the first storage transistor 411 may share the common source terminal S with the second storage transistor 412. The common source terminal S may be electrically connected to the source line SL. The first connection terminal J1 may correspond to the fourth impurity junction region 344. The first storage transistor 411 may share the first connection terminal J1 with the first selection transistor 421. The second connection terminal J2 may correspond to the fifth impurity junction region 345. The second storage transistor 412 may share the second connection terminal J2 with the second selection transistor 422.

The first selection transistor 421 may be coupled between a first drain terminal D1 and the first connection terminal J1. The first drain terminal D1 may correspond to the second impurity junction region 342. The second selection transistor 422 may be coupled between a second drain terminal D2 and the second connection terminal J2. The second drain terminal D2 may correspond to the third impurity junction region 343. The first and second drain terminals D1 and D2 of the first and second selection transistors 421 and 422 may be electrically connected to the bit line BL in common.

The first, third and fifth capacitors C1, C3 and C5 corresponding to parasitic capacitive components may be provided between the word line WL and the first floating gate FG1 and may be coupled in parallel between the word line WL and the first floating gate FG1. Thus, when a certain voltage is applied to the word line WL, a coupling voltage may be induced at the first floating gate FG1 by capacitive coupling of the first, third and fifth capacitors C1, C3 and C5. That is, a coupling voltage induced at the first floating gate FG1 may be determined by a sum of capacitances of the first, third and fifth capacitors C1, C3 and C5 which are coupled in parallel between the word line WL and the first floating gate FG1.

The second, fourth and sixth capacitors C2, C4 and C6 corresponding to parasitic capacitive components may be provided between the word line WL and the second floating gate FG2 and may be coupled in parallel between the word line WL and the second floating gate FG2. Thus, when a certain voltage is applied to the word line WL, a coupling voltage may be induced at the second floating gate FG2 by capacitive coupling of the second, fourth and sixth capacitors C2, C4 and C6. That is, a coupling voltage induced at the first floating gate FG2 may be determined by a sum of capacitances of the second, fourth and sixth capacitors C2, C4 and C6 which are coupled in parallel between the word line WL and the second floating gate FG2.

A program operation, an erasure operation and a read operation of the unit cell 300 may be performed in the same manner as described with reference to FIGS. 5 to 7. According to the present embodiment, a coupling ratio of the unit cell 300 may be greater than a coupling ratio of the unit cell 100 of FIGS. 1 to 3 because a total coupling capacitance between the word line WL and the first single-layered gate 361 or between the word line WL and the second single-layered gate 362 is greater than a total coupling capacitance between the word line WL and the first single-layered gate 161 or between the word line WL and the second single-layered gate 162.

Figure 13:
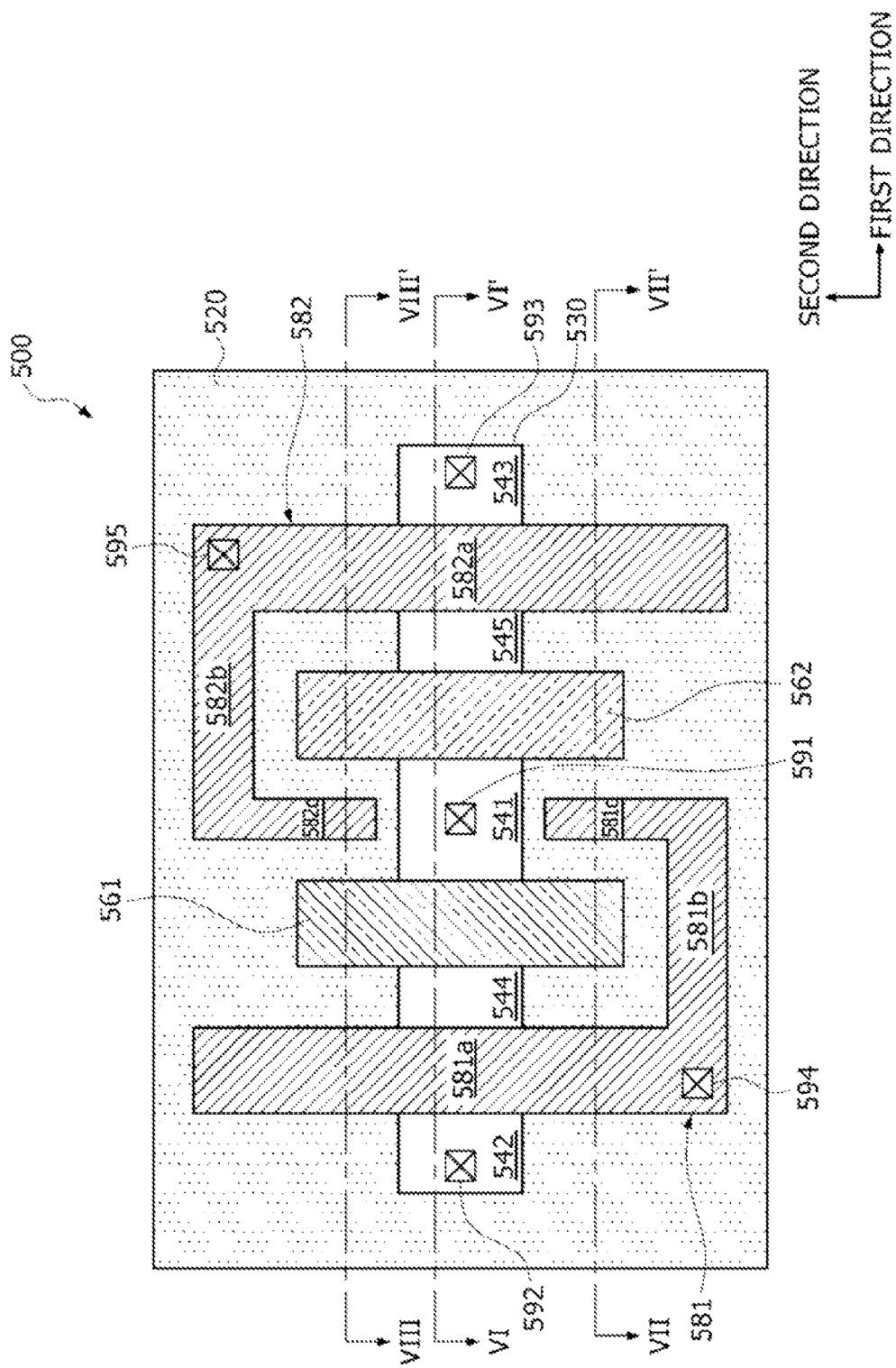
FIG. 13 is a layout diagram illustrating a unit cell of a nonvolatile memory device according to still another embodiment.
Figure 14:
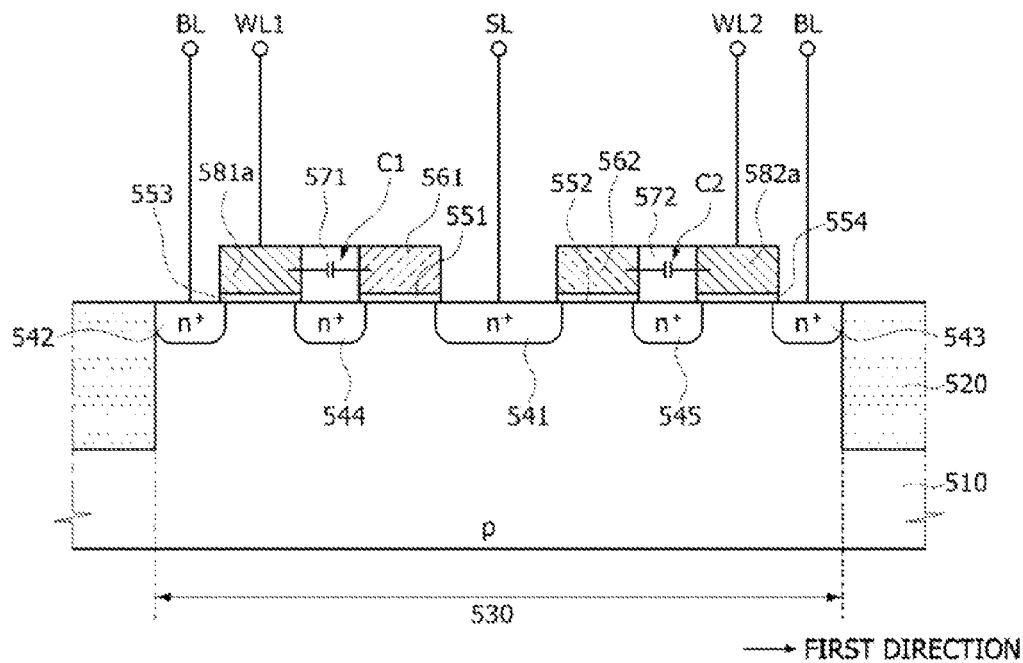
FIG. 14 is a cross-sectional view taken along a line VI-VI' of FIG. 13.
Figure 15:
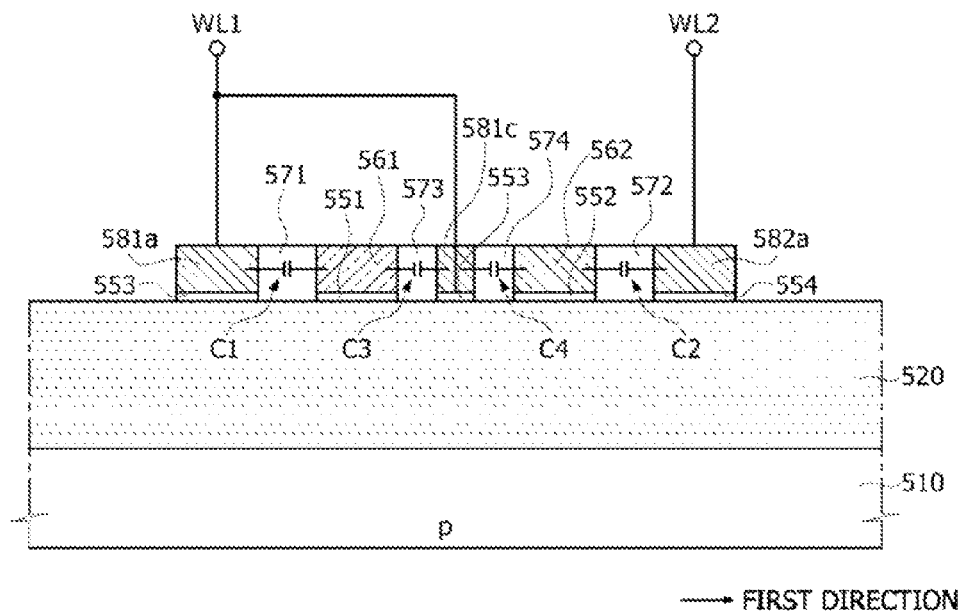
FIG. 15 is a cross-sectional view taken along a line VII-VII' of FIG. 13.
Figure 16:
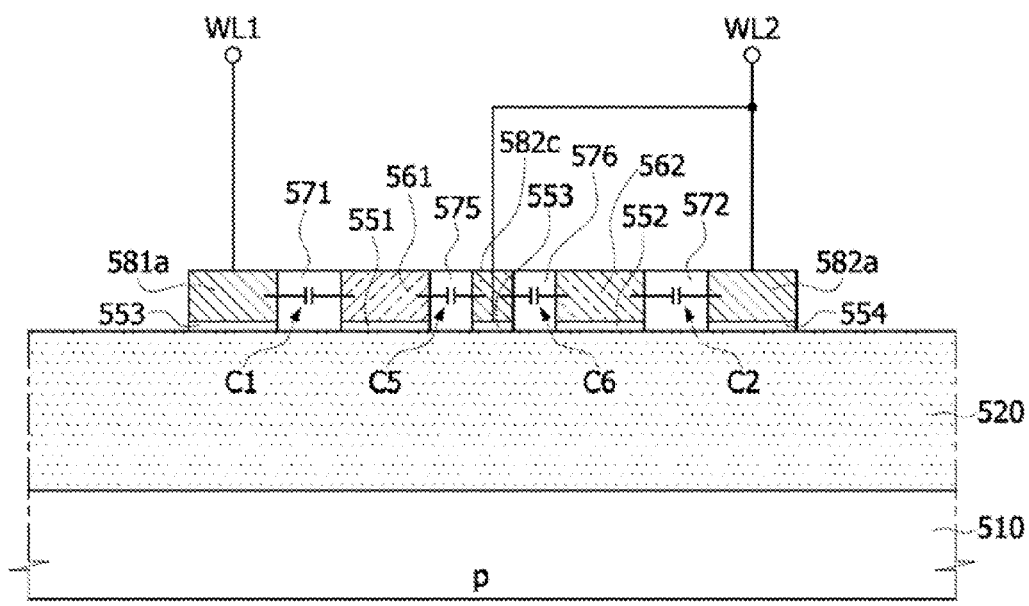
FIG. 16 is a cross-sectional view taken along a line VIII-VIII' of FIG. 13.

FIG. 13 is a layout diagram illustrating a unit cell 500 of a nonvolatile memory device according to still another embodiment. FIGS. 14 to 16 are cross-sectional views taken along lines VI-VI', VII-VII' and VIII-VIII' of FIG. 13, respectively.

Referring to FIGS. 13 to 16, the unit cell 500 may include two operation cells, each of which stores 1-bit data therein. Specifically, the unit cell 500 may include an active region 530 that is defined by an isolation layer 520 formed in a substrate 510. In some embodiments, the substrate 510 may be a single crystalline silicon substrate. Alternatively, the substrate 510 may be a semiconductor substrate other than a silicon substrate. In other embodiments, the substrate 510 may be a silicon-on-insulator (SOI) substrate including a support substrate, a buried insulation layer and a single crystalline silicon layer which are sequentially stacked. When the substrate 510 includes a semiconductor substrate or a semiconductor layer, the semiconductor substrate or the semiconductor layer may have a first conductivity type, for example, P-type conductivity. When the substrate 510 has a second conductivity type, i.e., N-type conductivity, opposite to the first conductivity type, a well region having the first conductivity type may be disposed in the substrate 510. The active region 530 may extend in a first direction. In the present embodiment, the first direction may be an arbitrary direction, and a second direction may be substantially perpendicular to the first direction.

A first impurity junction region 541, a second impurity junction region 542, a third impurity junction region 543, a fourth impurity junction region 544 and a fifth impurity junction region 545 may be disposed in an upper region of the active region 530 to be spaced apart from each other along the first direction. In some embodiments, the first impurity junction region 541 may act as a common source region, and the second and third impurity junction regions 542 and 543 may act as drain regions. All of the first to fifth impurity junction regions 541 to 545 may be heavily doped with impurities of the second conductivity type, for example, N-type impurities. The first impurity junction region 541 may be disposed in a central region of the active region 530. The second and third impurity junction regions 542 and 543 may be disposed in both ends of the active region 530, respectively. The fourth impurity junction region 544 may be disposed between the first and second impurity junction regions 541 and 542, and the fifth impurity junction region 545 may be disposed between the first and third impurity junction regions 541 and 543.

A first gate insulation layer 551 and a first single-layered gate 561 may be sequentially stacked on the active region 530 between the first and fourth impurity junction regions 541 and 544. A second gate insulation layer 552 and a second single-layered gate 562 may be sequentially stacked on the active region 530 between the first and fifth impurity junction regions 541 and 545. In some embodiments, each of the first and second gate insulation layers 551 and 552 may include a silicon oxide layer, and each of the first and second single-layered gates 561 and 562 may include a polysilicon layer. The first impurity junction region 541 may be exposed by a space between the first and second single-layered gates 561 and 562. As illustrated in FIG. 13, the first and second single-layered gates 561 and 562 may be disposed to intersect the active region 530 and to extend in the second direction. Thus, a portion of the first single-layered gate 561 may overlap with the active region 530, and the remaining portion of the first single-layered gate 561 may overlap with the isolation layer 520. Similarly, a portion of the second single-layered gate 562 may overlap with the active region 530, and the remaining portion of the second single-layered gate 562 may overlap with the isolation layer 520.

A first selection gate 581 may be disposed on a portion of the substrate 510. The first selection gate 581 may include a first selection gate main line 581*a* disposed at a side of the first single-layered gate 561 opposite to the second single-layered gate 562, a first selection gate extension 581*c* disposed between first ends of the first and second single-layered gates 561 and 562, and a first selection gate interconnection line 581*b* that connects a first end of the first selection gate main line 581*a* to a first end of the first selection gate extension 581*c*. A third gate insulation layer 553 may be disposed between the first selection gate 581 and the substrate 510. That is, the third gate insulation layer 553 may be disposed between the first selection gate 581 and the active region 530, and between the first selection gate 581 and the isolation layer 520. In some embodiments, the third gate insulation layer 553 may include a silicon oxide layer, and the first selection gate 581 may include a polysilicon layer.

The first selection gate main line 581*a* may be disposed to overlap with the active region 530 between the second and fourth impurity junction regions 542 and 544. Specifically, the first selection gate main line 581*a* may intersect the active region 530 and may extend in the second direction to be parallel with the first single-layered gate 561. The first selection gate main line 581*a* may be disposed at one side of the first single-layered gate 561 opposite to the second single-layered gate 562.

The first selection gate extension 581*c* may be disposed between the first ends of the first and second single-layered gates 561 and 562 to be parallel with the second direction. A second end of the first selection gate extension 581*c* may be adjacent to the active region 530 between the first and second single-layered gates 561 and 562. The first selection gate extension 581*c* may not overlap with the active region 530 but overlap with the isolation layer 520.

The first selection gate interconnection line 581*b* may be disposed to connect the first end of the first selection gate main line 581*a* to the first end of the first selection gate extension 581*c*. The first selection gate interconnection line 581*b* may not overlap with the active region 530 but overlap with the isolation layer 520. The first selection gate interconnection line 581*b* may extend parallel to the active region, i.e., in the first direction to have a stripe or line shape. The first selection gate interconnection line 581*b* may be spaced apart from the first single-layered gate 561 by a certain distance.

The first single-layered gate 561, the first selection gate 581, the first impurity junction region 541, the second impurity junction region 542, and the fourth impurity junction region 544 may constitute a first operation cell. The first single-layered gate 561, the first impurity junction region 541, and the fourth impurity junction region 544 may constitute a storage transistor of the first operation cell. The first selection gate 581, the second impurity junction region 542, and the fourth impurity junction region 544 may constitute a selection transistor of the first operation cell.

A second selection gate 582 may be disposed on a portion of the substrate 510. The first and second selection gates 581 and 582 may be disposed to be point symmetric with respect to a central point of the active region 530. The second selection gate 582 may include a second selection gate main line 582*a* disposed at a side of the second single-layered gate 562 opposite to the first single-layered gate 561, a second selection gate extension 582*c* disposed between second ends of the first and second single-layered gates 561 and 562, and a second selection gate interconnection line 582*b* that connects a first end of the second selection gate main line 582*a* to a first end of the second selection gate extension 582*c*. A fourth gate insulation layer 554 may be disposed between the second selection gate 582 and the substrate 510. That is, the fourth gate insulation layer 554 may be disposed between the second selection gate 582 and the active region 530, and between the second selection gate 582 and the isolation layer 520. In some embodiments, the fourth gate insulation layer 554 may include a silicon oxide layer, and the second selection gate 582 may include a polysilicon layer.

The second selection gate main line 582*a* may be disposed to overlap with the active region 530 between the third and fifth impurity junction regions 543 and 545. Specifically, the second selection gate main line 582*a* may intersect the active region 530 and may extend in the second direction to be parallel with the second single-layered gate 562. The second selection gate main line 582*a* may be disposed at one side of the second single-layered gate 562 opposite to the first single-layered gate 561.

The second selection gate extension 582*c* may be disposed between the second ends of the first and second single-layered gates 561 and 562 to be parallel with the second direction. A second end of the second selection gate extension 582*c* may be adjacent to the active region 530 between the first and second single-layered gates 561 and 562. The second selection gate extension 582*c* may not overlap with the active region 530 but overlap with the isolation layer 520.

The second selection gate interconnection line 582*b* may be disposed to connect the first end of the second selection gate main line 582*a* to the first end of the second selection gate extension 582*c*. The second selection gate interconnection line 582*b* may not overlap with the active region 530 but overlap with the isolation layer 520. The second selection gate interconnection line 582*b* may extend parallel to the active region, i.e., in the first direction to have a stripe or line shape. The second selection gate interconnection line 582*b* may be spaced apart from the second single-layered gate 562 by a certain distance.

The second single-layered gate 562, the second selection gate 582, the first impurity junction region 541, the third impurity junction region 543, and the fifth impurity junction region 545 may constitute a second operation cell. The second single-layered gate 562, the first impurity junction region 541, and the fifth impurity junction region 545 may constitute a storage transistor of the second operation cell. The second selection gate 582, the third impurity junction region 543, and the fifth impurity junction region 545 may constitute a selection transistor of the second operation cell.

As illustrated in FIGS. 14 to 16, a first dielectric layer 571 may be disposed between the first single-layered gate 561 and the first selection gate main line 581*a*, and a second dielectric layer 572 may be disposed between the second single-layered gate 562 and the second selection gate main line 582*a*. The first single-layered gate 561, the first dielectric layer 571 and the first selection gate main line 581*a* may constitute a first capacitor C1, and the second single-layered gate 562, the second dielectric layer 572 and the second selection gate main line 582*a* may constitute a second capacitor C2. Accordingly, a coupling voltage may be induced at the first single-layered gate 561 due to the first capacitor C1 when a predetermined voltage is applied to the first selection gate main line 581*a*, and a coupling voltage may also be induced at the second single-layered gate 562 due to the second capacitor C2 when a predetermined voltage is applied to the second selection gate main line 582*a*. In some embodiments, a dielectric constant of the first dielectric layer 571 may be substantially equal to a dielectric constant of the second dielectric layer 572.

The sidewall contact area between the first dielectric layer 571 and the first single-layered gate 561, or between the first dielectric layer 571 and the first selection gate main line 581a, may be substantially equal to the sidewall contact area between the second dielectric layer 572 and the second single-layered gate 562, or between the second dielectric layer 572 and the second selection gate main line 582a. In addition, a thickness of the first dielectric layer 571 in the first direction may be equal to a thickness of the second dielectric layer 572 in the first direction. In this case, a coupling ratio at the first single-layered gate 561, which denotes a capacitance of the first capacitor C1, may be substantially equal to a coupling ratio at the second single-layered gate 562, which denotes a capacitance of the second capacitor C2. Thus, when the same voltage is applied to the first and second selection gate main lines 581a and 582a, a coupling voltage induced at the first single-layered gate 561 by the first capacitor C1 may be substantially equal to a coupling voltage induced at the second single-layered gate 562 by the first capacitor C2.

As illustrated in FIG. 15, a third dielectric layer 573 may be disposed between the first single-layered gate 561 and the first selection gate extension 581c, and a fourth dielectric layer 574 may be disposed between the second single-layered gate 562 and the first selection gate extension 581c. The first single-layered gate 561, the third dielectric layer 573 and the first selection gate extension 581c may constitute a third capacitor C3, and the second single-layered gate 562, the fourth dielectric layer 574 and the first selection gate extension 581c may constitute a fourth capacitor C4. Accordingly, a coupling voltage induced at the first single-layered gate 561 may be determined by a voltage applied to the first selection gate extension 581c and a capacitive coupling of the third capacitor C3 in addition to the first capacitor C1, and a coupling voltage induced at the second single-layered gate 562 may be determined by a voltage applied to the first selection gate extension 581c and a capacitive coupling of the fourth capacitor C4 in addition to the second capacitor C2. In some embodiments, a dielectric constant of the third dielectric layer 573 may be substantially equal to a dielectric constant of the fourth dielectric layer 574.

As illustrated in FIG. 16, a fifth dielectric layer 575 may be disposed between the first single-layered gate 561 and the second selection gate extension 582c, and a sixth dielectric layer 576 may be disposed between the second single-layered gate 562 and the second selection gate extension 582c. The first single-layered gate 561, the fifth dielectric layer 575 and the second selection gate extension 582c may constitute a fifth capacitor C5, and the second single-layered gate 562, the sixth dielectric layer 576 and the second selection gate extension 582c may constitute a sixth capacitor C6. Accordingly, a coupling voltage induced at the first single-layered gate 561 may be determined by a voltage applied to the second selection gate extension 582c and a capacitive coupling of the fifth capacitor C5 in addition to the first capacitor C1, and a coupling voltage induced at the second single-layered gate 562 may be determined by a voltage applied to the second selection gate extension 582c and a capacitive coupling of the sixth capacitor C6 in addition to the second capacitor C2. In some embodiments, a dielectric constant of the fifth dielectric layer 575 may be substantially equal to a dielectric constant of the sixth dielectric layer 576. In some embodiments, a thickness of each of the third to sixth dielectric layers 573 to 576 in the first direction is less than a thickness of each of the first and second dielectric layers 571 and 572 in the first direction.

When a certain voltage is applied to the first selection gate 581, a coupling voltage induced at the first single-layered gate 561 may be determined by a sum of capacitances of the first and third and capacitors C1 and C3. Moreover, when a certain voltage is additionally applied to the second selection gate 582 in addition to the first selection gate 581, a coupling voltage induced at the first single-layered gate 561 may be determined by a sum of capacitances of the first, third and fifth capacitors C1, C3 and C5. Similarly, when a certain voltage is applied to the second selection gate 582, a coupling voltage induced at the second single-layered gate 562 may be determined by a sum of capacitances of the second and sixth capacitors C2 and C6. Moreover, when a certain voltage is additionally applied to the first selection gate 581 in addition to the second selection gate 582, a coupling voltage induced at the second single-layered gate 562 may be determined by a sum of capacitances of the second, sixth and fourth capacitors C2, C6 and C4.

The first impurity junction region 541 may be electrically connected to a source line SL through a first contact 591. Moreover, the second and third impurity junction regions 542 and 543 may be electrically connected to a bit line BL in common through a second contact 592 and a third contact 593, respectively. The first selection gate 581 may be electrically connected to a first word line WL1 through a fourth contact 594, and the second selection gate 582 may be electrically connected to a second word line WL2 through a fifth contact 595.

Figure 17:
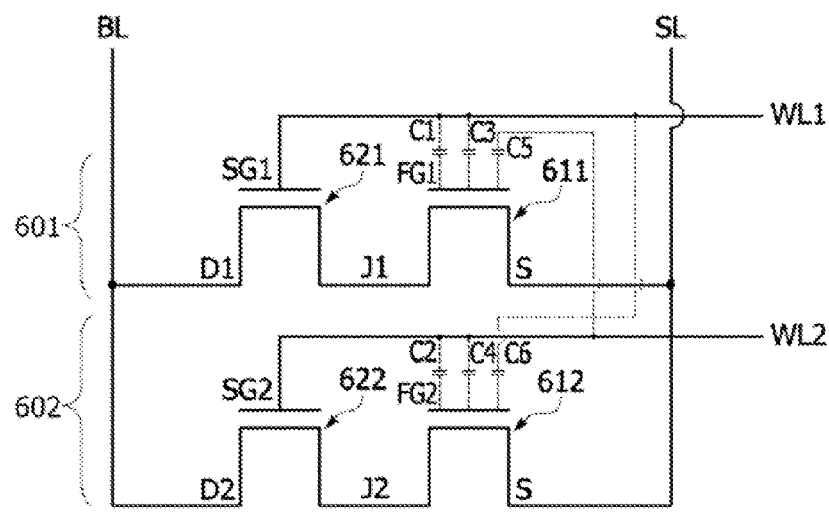
FIG. 17 is an equivalent circuit of the unit cell shown in FIG. 13.

FIG. 17 is an equivalent circuit of the unit cell 500 shown in FIG. 13.

Referring to FIGS. 13 to 17, the unit cell 500 may be configured to include a first operation cell 601 and a second operation cell 602. The first operation cell 601 may include a first storage transistor 611 and a first storage transistor 621, and the second operation cell 602 may include a second storage transistor 612 and a second selection transistor 622. The first storage transistor 611 may include a first floating gate FG1 which is electrically isolated, and the second storage transistor 612 may include a second floating gate FG2 which is electrically isolated. The first and second floating gates FG1 and FG2 may correspond to the first and second single-layered gates 561 and 562, respectively. The first selection transistor 621 may include a first selection gate terminal SG1, and the second selection transistor 622 may include a second selection gate terminal SG2. The first and second selection gate terminals SG1 and SG2 may correspond to the first and second selection gate 581 and 582, respectively. The first selection gate terminal SG1 of the first selection transistor 621 may be electrically connected to the first word line WL1, and second selection gate terminal SG2 of the second selection transistor 622 may be electrically connected to the second word line WL2.

The first storage transistor 611 may be coupled between a common source terminal S and a first connection terminal J1. The second storage transistor 612 may be coupled between the common source terminal S and a second connection terminal J2. The common source terminal S may correspond to the first impurity junction region 541, and the first storage transistor 611 may share the common source terminal S with the second storage transistor 612. The common source terminal S may be electrically connected to the source line SL. The first connection terminal J1 may correspond to the fourth impurity junction region 544. The first storage transistor 611 may share the first connection terminal J1 with the first selection transistor 621. The second connection terminal J2 may correspond to the fifth impurity junction region 545. The second storage transistor 612 may share the second connection terminal J2 with the second selection transistor 622.

The first selection transistor 621 may be coupled between a first drain terminal D1 and the first connection terminal J1. The first drain terminal D1 may correspond to the second impurity junction region 542. The second selection transistor 622 may be coupled between a second drain terminal D2 and the second connection terminal J2. The second drain terminal D2 may correspond to the third impurity Junction region 543. The first and second drain terminals D1 and D2 of the first and second selection transistors 621 and 622 may be electrically connected to the bit line BL in common.

The first and third capacitors C1 and C3 corresponding to parasitic capacitive components may be provided between the first word line WL1 and the first floating gate FG1 and may be coupled in parallel between the first word line WL1 and the first floating gate FG1. The fifth capacitor C5 corresponding to a parasitic capacitive component may be coupled between the second word line WL2 and the first floating gate FG1. The first, third and fifth capacitors C1, C3 and C5 may be coupled in parallel to the first floating gate FG1. Thus, when a certain voltage is applied to the first word line WL1, a coupling voltage may be induced at the first floating gate FG1 by capacitive coupling of the first and third capacitors C1 and C3. That is, a coupling voltage induced at the first floating gate FG1 may be determined by a sum of capacitances of the first and third capacitors C1 and C3 which are coupled in parallel between the first word line WL1 and the first floating gate FG1.

The second and fourth capacitors C2 and C4 corresponding to parasitic capacitive components may be provided between the second word line WL2 and the second floating gate FG2 and may be coupled in parallel between the second word line WL2 and the second floating gate FG2. The sixth capacitor C6 corresponding to a parasitic capacitive component may be coupled between the first word line WL1 and the second floating gate FG2. The second, fourth and sixth capacitors C2, C4 and C6 may be coupled in parallel to the second floating gate FG2. Thus, when a certain voltage is applied to the second word line WL2, a coupling voltage may be induced at the second floating gate FG2 by capacitive coupling of the second and fourth capacitors C2 and C4. That is, a coupling voltage induced at the second floating gate FG2 may be determined by a sum of capacitances of the second and fourth capacitors C2 and C4 which are coupled in parallel between the second word line WL2 and the second floating gate FG2.

Figure 18:
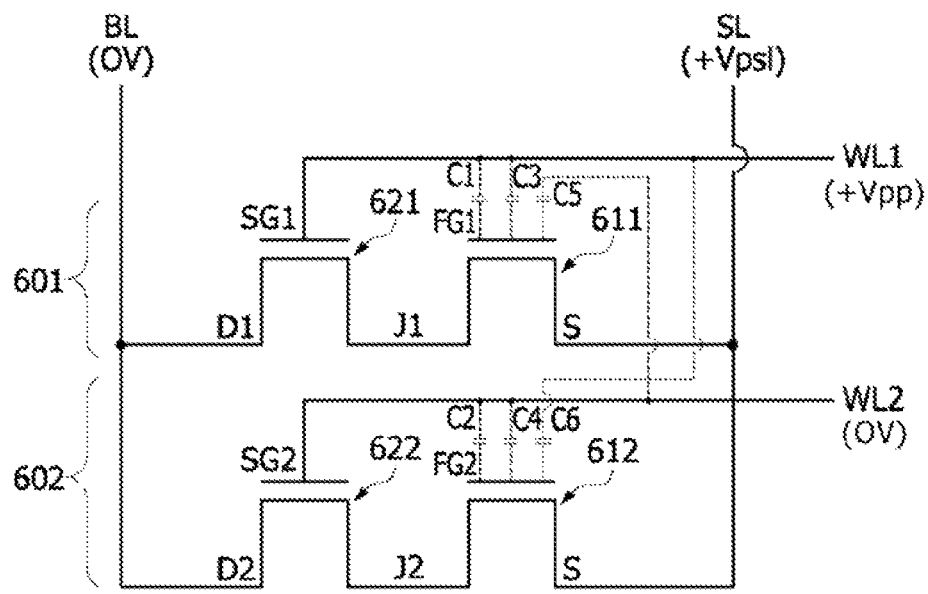
FIG. 18 is a circuit diagram illustrating a program operation of the unit cell shown in FIG. 17.

FIG. 18 is a circuit diagram illustrating a program operation of the unit cell shown in FIG. 17. The program operation according to the present embodiment may be performed by a hot carrier injection mechanism.

Referring to FIGS. 14, 15, 16 and 18, a positive program voltage +Vpp and a positive program source line voltage +Vpsl may be respectively applied to the first word line WL1 and the source line SL to program the first operation cell 601 of the unit cell. In addition, the second word line WL2 and the bit line BL may be grounded to program the first operation cell 601 of the unit cell. Although not shown in the drawings, bodies (e.g., the substrate 510) of the first and second storage transistors 611 and 612 and the first and second selection transistors 621 and 622 may also be grounded to program the first operation cell 601 of the unit cell. In some embodiments, the positive program voltage +Vpp may be about 8 V, and the positive program source line voltage +Vpsl may be about 4 V.

The positive program voltage +Vpp may be applied to the first selection gate terminal SG1, i.e., the first selection gate main lines 581a, through the first word line WL1, thereby turning on the first selection transistor 621. When the first selection transistor 621 is turned on, an electric potential of a ground voltage applied to the bit line BL may be transmitted to the first connection terminal J1, i.e., the fourth impurity junction region 544, through the first drain terminal D1, i.e., the second impurity junction region 542. When the positive program voltage +Vpp is applied to the first word line WL1, a coupling voltage may be induced at the first floating gate FG1, i.e., the first single-layered gate 561, by capacitive coupling of the first and third capacitors C1 and C3 which are coupled in parallel between the first word line WL1 and the first floating gate FG1. In this case, the first storage transistor 611 may be turned on or off in response to a threshold voltage thereof and the coupling voltage induced at the first floating gate FG1. When the first storage transistor 611 is turned on, an inversion channel may be formed between the common source terminal S, i.e., the first impurity junction region 541, and the first connection terminal J1, i.e., the fourth impurity junction region 544.

Because the positive program source line voltage +Vpsl applied to the common source terminal S is higher than the ground voltage applied to the first connection terminal J1, the inversion channel of the first storage transistor 611 may be pinched off at the vicinity of the common source terminal S, i.e., the first impurity junction region 541, to create a strong horizontal electric field between the inversion channel and the first impurity junction region 541. Hot electrons may be generated at the vicinity of the common source terminal S, i.e., the first impurity junction region 541, due to the strong horizontal electric field between the inversion channel of the first storage transistor 611 and the first impurity junction region 541, and the hot electrons may be injected into the first floating gate FG1, i.e., the first single-layered gate 561, through the first gate insulation layer 551 due to a vertical electric field which is created by a coupling voltage induced at the first floating gate terminal FG1, i.e., the first single-layered gate 561. As a result, the first storage transistor 611 may be programmed.

Since the ground voltage is applied to the second selection gate terminal SG2, i.e., the second selection gate main lines 582a, through the second word line WL2, the second selection transistor 622 may be turned off. When the second selection transistor 622 is turned off, an electric potential of the ground voltage applied to the bit line BL may not be transmitted to the second connection terminal J2, i.e., the fifth impurity junction region 545, through the second drain terminal D2, i.e., the third impurity junction region 543. That is, the second connection terminal J2, i.e., the fifth impurity junction region 545, may float. In addition, because the second word line WL2 is grounded and the substrate 510 is also grounded, a voltage induced at the second floating gate FG2 may not be influenced by capacitive coupling of the second and fourth capacitors C2 and C4. Thus, no hot electrons may be generated at the vicinity of the first impurity junction region 541 adjacent to the second single-layered gate 562, i.e., the second floating gate FG2, of the second storage transistor 612. Accordingly, no electrons are injected into the second single-layered gate 562, i.e., the second floating gate FG2, of the second storage transistor 612. As a result, the second operation cell 602 may not be programmed.

When the positive program voltage +Vpp is applied to the first word line WL1, a coupling voltage may be induced at the second single-layered gate 562, i.e., the second floating gate FG2, by a capacitive coupling of the sixth capacitor C6 which is coupled between the second single-layered gate 562 and the first word line WL1. However, the coupling voltage induced at the second single-layered gate 562 by only the sixth capacitor C6 may be lower than a threshold voltage of the second storage transistor 612 and may be controlled by adjusting a magnitude of the positive program voltage +Vpp applied to the first word line WL1. Even though the coupling voltage induced at the second single-layered gate 562 by only the sixth capacitor C6 is higher than a threshold voltage of the second storage transistor 612, the second storage transistor 612 may not be programmed because the second connection terminal J2, i.e., the fifth impurity junction region 545, floats.

Although the present embodiment is described in conjunction with an example in which the first operation cell 601 of the unit cell is selectively programmed, the second operation cell 602 may also be selectively programmed by switching the voltages applied to the first and second word lines WL1 and WL2. When the positive program voltage +Vpp is applied to both of the first and second word lines WL1 and WL2, one of the first and second operation cells 601 and 602 may be used as a redundancy cell.

Figure 19:
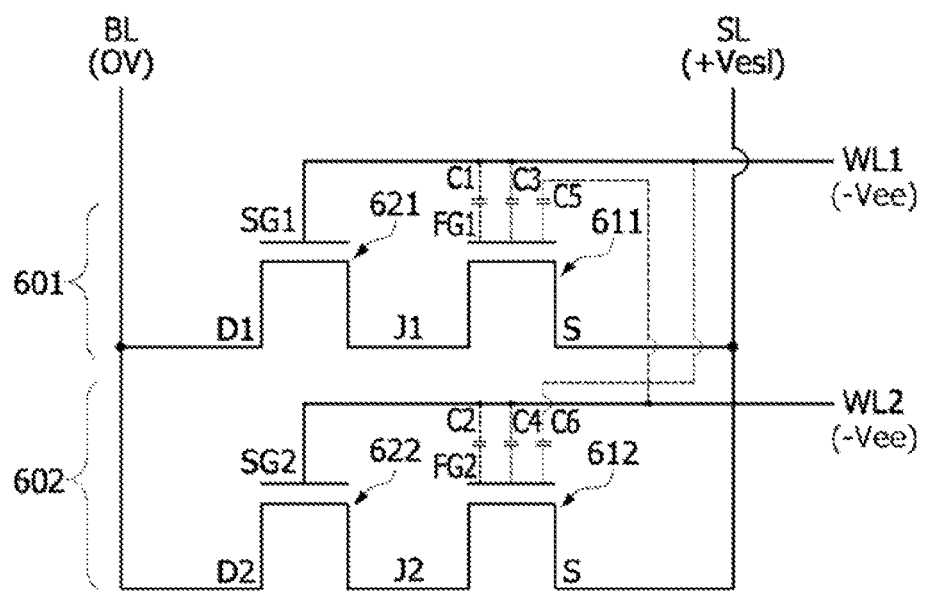
FIG. 19 is a circuit diagram illustrating an erasure operation of the unit cell shown in FIG. 17.

FIG. 19 is a circuit diagram illustrating an erasure operation of the unit cell shown in FIG. 17. The erasure operation according to the present embodiment may be performed by a band-to-band tunneling (BTBT) mechanism.

Referring to FIGS. 14, 15, 16 and 19, to erase data stored in the first and second operation cells 601 and 602 of the unit cell, a negative erasure voltage −Vee may be applied to the first and second word lines WL1 and WL2 and a positive erasure source line voltage +Vesl may be applied to the source line SL. In addition, the bit line BL may be grounded to erase the data stored in the first and second operation cells 601 and 602 of the unit cell. Although not shown in the drawings, bodies (e.g., the substrate 510) of the first and second storage transistors 611 and 612 and the first and second selection transistors 621 and 622 may also be grounded to erase the data stored in the first and second operation cells 601 and 602 of the unit cell. In some embodiments, the negative erasure voltage −Vee may be about −8 V, and the positive erasure source line voltage +Vesl may be about 5.5 V.

When the negative erasure voltage −Vee is applied to the first and second word lines WL1 and WL2, a negative coupling voltage may be induced at the first floating gate FG1, i.e., the first single-layered gate 561, by capacitive coupling of the first, third and fifth capacitors C1, C3 and C5. Similarly, when the negative erasure voltage −Vee is applied to the first and second word lines WL1 and WL2, a negative coupling voltage may also be induced at the second floating gate FG2, i.e., the second single-layered gate 562, by capacitive coupling of the second, fourth and sixth capacitors C2, C4 and C6. When a negative coupling voltage is induced at the first floating gate FG1, i.e., the first single-layered gate 561, and the positive erasure source line voltage +Vesl is applied to the common source terminal S, i.e., the first impurity junction region 541, through the source line SL, the electrons stored in the first floating gate FG1, i.e., the first single-layered gate 561, may be injected into the common source terminal S, i.e., the first impurity junction region 541, through the first gate insulation layer 551. As a result, the first storage transistor 611 may be erased. Similarly, when a negative coupling voltage is induced at the second floating gate FG2, i.e., the second single-layered gate 562, and the positive erasure source line voltage +Vesl is applied to the common source terminal S, i.e., the first impurity junction region 541, through the source line SL, the electrons stored in the second floating gate FG2, i.e., the second single-layered gate 562, may be injected into the common source terminal S, i.e., the first impurity junction region 541, through the second gate insulation layer 552. As a result, the second storage transistor 612 may be erased.

Although the present embodiment is described in conjunction with an example in which the first and second operation cells 601 and 62 of the unit cell are simultaneously erased, any one of the first and second operation cells 601 and 602 may be selectively erased by applying the negative erasure voltage −Vee to any one selected from the first and second word lines WL1 and WL2 and by applying a ground voltage to the unselected word line. The selected operation cell having a word line to which the negative erasure voltage −Vee is applied may be erased by a BTBT mechanism, whereas the unselected operation cell having a word line to which the ground voltage is applied may not be erased because an electric field created between the grounded word line and the common source terminal S, i.e., the first impurity junction region 541, to which the positive erasure source line voltage +Vesl is applied, is not sufficient to cause a BTBT phenomenon.

Figure 20:
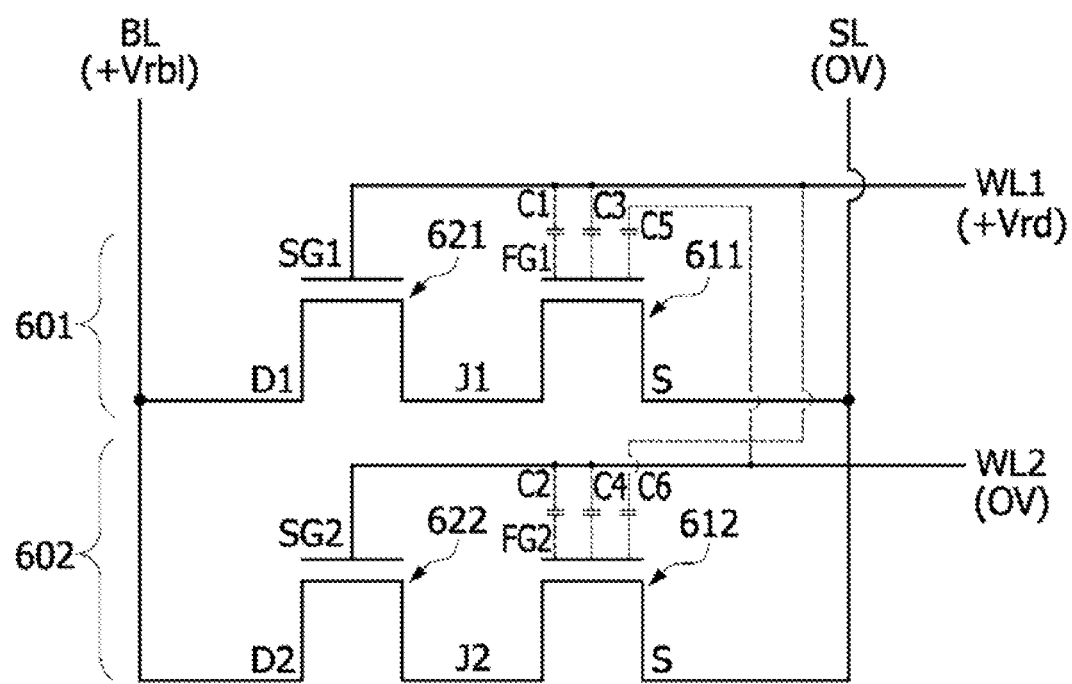
FIG. 20 is a circuit diagram illustrating a read operation of the unit cell shown in FIG. 17.

FIG. 20 is a circuit diagram illustrating a read operation of the unit cell shown in FIG. 17.

Referring to FIGS. 14, 15, 16 and 20, a positive read voltage +Vrd and a positive read bit line voltage +Vrbl may be respectively applied to the first word line WL1 and the bit line BL to selectively read out the data stored in the first operation cell 601 of the unit cell. In addition, the second word line WL2 and the source line SL may be grounded to selectively read out the data stored in the first operation cell 601 of the unit cell. Although not shown in the drawings, bodies (e.g., the substrate 510) of the first and second storage transistors 611 and 612 and the first and second selection transistors 621 and 622 may also be grounded to selectively read out the data stored in the first operation cell 601 of the unit cell. In some embodiments, the positive read voltage +Vrd may be about 3.3 V, and the positive read bit line voltage +Vrbl may be about 1.0 V.

When the positive read voltage +Vrd is applied to the first selection gate terminal SG1, i.e., the first selection gate main line 581a, through the first word line WL1, the first selection transistor 621 may be turned on. When the first selection transistor 621 is turned on, an electric potential of the positive read bit line voltage +Vrbl applied to the bit line BL may be transmitted to the first connection terminal J1, i.e., the fourth impurity junction region 544, through the first drain terminal D1, i.e., the second impurity junction region 542. When the positive read voltage +Vrd is applied to the first word line WL1, a coupling voltage may be induced at the first floating gate FG1, i.e., the first single-layered gate 561, by capacitive coupling of the first and third capacitors C1 and C3. That is, a coupling voltage induced at the first floating gate FG1, i.e., the first single-layered gate 561, may be determined by a sum of capacitances of the first and third capacitors C1 and C3.

When a coupling voltage is induced at the first floating gate FG1, i.e., the first single-layered gate 561, the first storage transistor 611 may be turned on or off in response to a threshold voltage thereof. For example, when the first storage transistor 611 is programmed to have a threshold voltage which is higher than the coupling voltage induced at the first floating gate FG1, i.e., the first single-layered gate 561, the first storage transistor 611 may be turned off. In this case, no bit line current may flow through the first storage transistor 611 even though the first selection transistor 621 is turned on. In contrast, when the first storage transistor 611 is erased to have a threshold voltage which is lower than the coupling voltage induced at the first floating gate FG1, i.e., the first single-layered gate 561, the first storage transistor 611 may be turned on. In this case, bit line current may flow through the first storage transistor 611 when the first selection transistor 621 is turned on. A voltage level of the bit line may be sensed and amplified by a sense amplifier (not shown), and the sense amplifier may determine whether the data stored in the first storage transistor 611 is a logic "high" level or a logic "low" level.

Meanwhile, when the ground voltage is applied to the second selection gate terminal SG2, i.e., the second selection gate main line 582*a*, through the second word line WL2, the second selection transistor 622 may be turned off. When the second selection transistor 622 is turned off, an electric potential of the positive read bit line voltage +Vrbl applied to the bit line BL may not be transmitted to the second connection terminal J2, i.e., the fifth impurity junction region 545, through the second drain terminal D2, i.e., the third impurity junction region 543. Thus, the second connection terminal J2, i.e., the fifth impurity junction region 545, may float. Accordingly, no current may flow through the second operation cell 602. As a result, the second operation cell 602 may not affect the read operation of the first operation cell 601.

The embodiments of the present disclosure have been disclosed above for illustrative purposes. Those of ordinary skill in the art will appreciate that various modifications, additions, and substitutions are possible, without departing from the scope and spirit of the present disclosure as claimed below.

What is claimed is:

1. A nonvolatile memory device comprising:
   an active region extending in a first direction;
   a first single-layered gate intersecting the active region and extending in a second direction;
   a second single-layered gate intersecting the active region to be spaced apart from the first single-layered gate in the first direction and extending in the second direction; and
   a selection gate including a first selection gate main line and a second selection gate main line that intersect the active region to be parallel with the first and second single-layered gates, a selection gate interconnection line that connects a first end of the first selection gate main line to a first end of the second selection gate main line, and a selection gate extension that extends from a portion of the selection gate interconnection line to be disposed between first ends of the first and second single-layered gates,
   wherein the first selection gate main line is at a side of the first single-layered gate, opposite to the second single-layered gate; and
   wherein the second selection gate main line is at a side of the second single-layered gate, opposite to the first single-layered gate wherein the selection gate extension does not overlap with the active region and an end of the selection gate extension is adjacent to the active region.

2. The nonvolatile memory device of claim 1, wherein the second direction is substantially perpendicular to the first direction.

3. The nonvolatile memory device of claim 1, further comprising:
   a first impurity junction region disposed in the active region between the first and second single-layered gates;
   a second impurity junction region disposed in a first end of the active region;
   a third impurity junction region disposed in a second end of the active region;
   a fourth impurity junction region disposed in the active region between the first single-layered gate and the first selection gate main line; and
   a fifth impurity junction region disposed in the active region between the second single-layered gate and the second selection gate main line.

4. The nonvolatile memory device of claim 1, further comprising:
   a first gate insulation layer between the first single-layered gate and the active region;
   a second gate insulation layer between the second single-layered gate and the active region; and
   a third gate insulation layer between the selection gate and the active region.

5. The nonvolatile memory device of claim 1, further comprising:
   a first dielectric layer between the first single-layered gate and the first selection gate main line;
   a second dielectric layer between the second single-layered gate and the second selection gate main line;
   a third dielectric layer between the first single-layered gate and the selection gate extension; and
   a fourth dielectric layer between the second single-layered gate and the selection gate extension.

6. The nonvolatile memory device of claim 3,
   wherein the first and second single-layered gates are electrically isolated;
   wherein the selection gate is electrically connected to a word line;
   wherein the first impurity junction region is electrically connected to a source line; and
   wherein the second and third impurity junction regions are electrically connected to a bit line.

7. The nonvolatile memory device of claim 3, wherein the first to fifth impurity junction regions are doped with N-type impurities.

8. The nonvolatile memory device of claim 5, wherein a thickness of the third dielectric layer in the first direction is substantially equal to a thickness of the fourth dielectric layer in the first direction.

9. The nonvolatile memory device of claim 8, wherein a thickness of each of the third and fourth dielectric layers in the first direction is less than a thickness of each of the first and second dielectric layers in the first direction.

10. A nonvolatile memory device comprising:
    an active region extending in a first direction;
    a first single-layered gate intersecting the active region and extending in a second direction;
    a second single-layered gate intersecting the active region to be spaced apart from the first single-layered gate in the first direction and extending in the second direction; and
    a selection gate including a first selection gate main line and a second selection gate main line that intersect the active region to be parallel with the first and second single-layered gates, a first selection gate interconnection line that connects a first end of the first selection gate main line to a first end of the second selection gate main line, a second selection gate interconnection line that connects a second end of the first selection gate main line to a second end of the second selection gate main line, a first selection gate extension that extends from a portion of the first selection gate interconnection line to be disposed between first ends of the first and second single-layered gates, and a second selection gate extension that extends from a portion of the second selection gate interconnection line to be disposed between second ends of the first and second single-layered gates, wherein the first selection gate main line is at a side of the first single-layered gate, opposite to the second single-layered gate; and wherein the second selection gate main line is at a side of the second single-layered gate, opposite to the first single-layered gate wherein the first selection gate extension does not overlap with the active region and an end of the first selection gate extension is adjacent to a first sidewall of the active region, opposite to the second selection gate extension; and wherein the second selection gate extension does not overlap with the active region and an end of the second selection gate extension is adjacent to a second sidewall of the active region, opposite to the first selection gate extension.

11. The nonvolatile memory device of claim 10, further comprising:
a first impurity junction region in the active region, between the first and second single-layered gates;
a second impurity junction region in a first end of the active region;
a third impurity junction region in a second end of the active region;
a fourth impurity junction region in the active region, between the first single-layered gate and the first selection gate main line; and
a fifth impurity junction region in the active region between the second single-layered gate and the second selection gate main line.

12. The nonvolatile memory device of claim 10, further comprising:
a first dielectric layer between the first single-layered gate and the first selection gate main line;
a second dielectric layer between the second single-layered gate and the second selection gate main line;
a third dielectric layer between the first single-layered gate and the first selection gate extension;
a fourth dielectric layer between the second single-layered gate and the first selection gate extension;
a fifth dielectric layer between the first single-layered gate and the second selection gate extension; and
a sixth dielectric layer between the second single-layered gate and the second selection gate extension.

13. The nonvolatile memory device of claim 11,
wherein the first and second single-layered gates are electrically isolated;
wherein the selection gate is electrically connected to a word line;
wherein the first impurity junction region is electrically connected to a source line; and
wherein the second and third impurity junction regions are electrically connected to a bit line.

14. A nonvolatile memory device comprising:
an active region extending in a first direction;
a first single-layered gate intersecting the active region and extending in a second direction;
a second single-layered gate intersecting the active region to be spaced apart from the first single-layered gate in the first direction and extending in the second direction;
a first selection gate including a first selection gate main line that intersects the active region to be parallel with the first single-layered gate, a first selection gate extension that is between first ends of the first and second single-layered gates, and a first selection gate interconnection line that connects a first end of the first selection gate main line to a first end of the first selection gate extension; and a second selection gate including a second selection gate main line that intersects the active region to be parallel with the second single-layered gate, a second selection gate extension that is between second ends of the first and second single-layered gates, and a second selection gate interconnection line that connects a first end of the second selection gate main line to a first end of the second selection gate extension, wherein the first selection gate main line is at a side of the first single-layered gate, opposite to the second single-layered gate; and wherein the second selection gate main line is at a side of the second single-layered gate, opposite to the first single-layered gate wherein the first selection gate extension does not overlap with the active region and a second end of the first selection gate extension is adjacent to a first sidewall of the active region, opposite to the second selection gate extension; and wherein the second selection gate extension does not overlap with the active region and a second end of the second selection gate extension is adjacent to a second sidewall of the active region, opposite to the first selection gate extension.

15. The nonvolatile memory device of claim 14, further comprising:
a first impurity junction region in the active region, between the first and second single-layered gates;
a second impurity junction region in a first end of the active region;
a third impurity junction region in a second end of the active region;
a fourth impurity junction region in the active region, between the first single-layered gate and the first selection gate main line; and
a fifth impurity junction region in the active region, between the second single-layered gate and the second selection gate main line.

16. The nonvolatile memory device of claim 14, further comprising:
a first dielectric layer between the first single-layered gate and the first selection gate main line;
a second dielectric layer between the second single-layered gate and the second selection gate main line;
a third dielectric layer between the first single-layered gate and the first selection gate extension;
a fourth dielectric layer between the second single-layered gate and the first selection gate extension;
a fifth dielectric layer between the first single-layered gate and the second selection gate extension; and
a sixth dielectric layer between the second single-layered gate and the second selection gate extension.

17. The nonvolatile memory device of claim 15,
wherein the first and second single-layered gates are electrically isolated;
wherein the first selection gate is electrically connected to a first word line;
wherein the second selection gate is electrically connected to a second word line;

wherein the first impurity junction region is electrically connected to a source line; and wherein the second and third impurity junction regions are electrically connected to a bit line.

* * * * *